(12) United States Patent
Yoshimura et al.

(10) Patent No.: US 9,768,246 B2
(45) Date of Patent: Sep. 19, 2017

(54) SEMICONDUCTOR DEVICE AND METHOD FOR PRODUCING SEMICONDUCTOR DEVICE

(71) Applicant: FUJI ELECTRIC CO., LTD., Kawasaki-shi (JP)

(72) Inventors: Takashi Yoshimura, Matsumoto (JP); Masayuki Miyazaki, Matsumoto (JP); Hiroshi Takishita, Matsumoto (JP); Hidenao Kuribayashi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/008,826

(22) Filed: Jan. 28, 2016

(65) Prior Publication Data

US 2016/0163786 A1 Jun. 9, 2016

Related U.S. Application Data

(60) Division of application No. 14/276,546, filed on May 13, 2014, now Pat. No. 9,276,071, which is a
(Continued)

(30) Foreign Application Priority Data

Dec. 28, 2011 (JP) .................................. 2011-287269

(51) Int. Cl.
*H01L 21/04* (2006.01)
*H01L 21/425* (2006.01)
(Continued)

(52) U.S. Cl.
CPC .......... *H01L 29/063* (2013.01); *H01L 21/263* (2013.01); *H01L 21/26506* (2013.01);
(Continued)

(58) Field of Classification Search
CPC ... H01L 29/32; H01L 29/7395; H01L 29/861; H01L 29/1095
(Continued)

(56) References Cited

U.S. PATENT DOCUMENTS 6,100,575 A * 8/2000 Minato ................. H01L 21/263
257/335
6,762,097 B2 * 7/2004 Takei .................... H01L 21/263
257/E21.383
(Continued)

FOREIGN PATENT DOCUMENTS

JP H2-076265 A 3/1990
JP H8-148699 A 6/1996
(Continued)

OTHER PUBLICATIONS

Office Action issued in JP Appln. No. 2015-046522 mailed Apr. 19, 2016. English translation provided.
(Continued)

*Primary Examiner* — Hsien Ming Lee
(74) *Attorney, Agent, or Firm* — Rossi, Kimms & McDowell LLP

(57) ABSTRACT

Hydrogen atoms and crystal defects are introduced into an n– semiconductor substrate by proton implantation. The crystal defects are generated in the n– semiconductor substrate by electron beam irradiation before or after the proton implantation. Then, a heat treatment for generating donors is performed. The amount of crystal defects is appropriately controlled during the heat treatment for generating donors to increase a donor generation rate. In addition, when the heat treatment for generating donors ends, the crystal defects formed by the electron beam irradiation and the proton implantation are recovered and controlled to an appropriate amount of crystal defects. Therefore, for example, it is
(Continued)

possible to improve a breakdown voltage and reduce a leakage current.

14 Claims, 19 Drawing Sheets

Related U.S. Application Data continuation of application No. PCT/JP2012/084241, filed on Dec. 28, 2012.

(51) Int. Cl.

| | | |
|---|---|---|
| H01L 21/265 | (2006.01) | |
| H01L 29/30 | (2006.01) | |
| H01L 29/06 | (2006.01) | |
| H01L 29/32 | (2006.01) | |
| H01L 29/36 | (2006.01) | |
| H01L 29/66 | (2006.01) | |
| H01L 29/739 | (2006.01) | |
| H01L 29/861 | (2006.01) | |
| H01L 29/08 | (2006.01) | |
| H01L 21/263 | (2006.01) | |
| H01L 29/10 | (2006.01) | |
| H01L 21/324 | (2006.01) | |

(52) U.S. Cl.
CPC ...... *H01L 21/26513* (2013.01); *H01L 21/324* (2013.01); *H01L 29/0834* (2013.01); *H01L 29/1095* (2013.01); *H01L 29/32* (2013.01); *H01L 29/36* (2013.01); *H01L 29/66128* (2013.01); *H01L 29/7395* (2013.01); *H01L 29/861* (2013.01); *H01L 29/8611* (2013.01); *H01L 29/0619* (2013.01)

(58) Field of Classification Search
USPC ......... 438/511, 514, 515, 520, 522; 257/617
See application file for complete search history.

(56) References Cited

U.S. PATENT DOCUMENTS

| | | |
|---|---|---|
| 8,084,814 B2 | 12/2011 | Nemoto et al. |
| 8,846,544 B2 | 9/2014 | Misumi et al. |
| 2006/0286753 A1 | 12/2006 | Barthelmess et al. |
| 2007/0278514 A1* | 12/2007 | Schulze ................ H01L 21/263 257/173 |
| 2008/0315364 A1 | 12/2008 | Nemoto et al. |
| 2009/0184340 A1 | 7/2009 | Nemoto et al. |
| 2009/0224284 A1* | 9/2009 | Nemoto .............. H01L 21/2255 257/109 |
| 2011/0140243 A1 | 6/2011 | Misumi et al. |
| 2012/0267681 A1 | 10/2012 | Nemoto et al. |

FOREIGN PATENT DOCUMENTS

| | | |
|---|---|---|
| JP | 09232332 A | 9/1997 |
| JP | 2011-049300 A | 3/2001 |
| JP | 2008091853 A | 4/2008 |
| JP | 2008-211148 A | 9/2008 |
| JP | 2009099705 A | 5/2009 |
| JP | 2009176892 A | 8/2009 |
| JP | 2009188336 A | 8/2009 |
| JP | 2011146673 A | 7/2011 |
| JP | 2011159654 A | 8/2011 |
| WO | 2007055352 A1 | 5/2007 |
| WO | 2011052787 A1 | 5/2011 |
| WO | 2013-100155 A1 | 7/2013 |

OTHER PUBLICATIONS

International Search Report issued in PCT/JP2012/084241, Mailing date Apr. 2, 2013.
Official Action issued in JP2013-551872, mailed Jan. 6, 2015.
Klug et al. "N-type Doping of Silicon by Proton Implantation", Proceedings of the 2011-14th European Conference on Power Electronics and Applications (EPE 2011), Aug. 31, 2011, pp. 1-7, XP055189405. Cited in EPSR issued in appln. No. EP12862913.6, dated May 27, 2015.
European Search Report issued in European application No. EP12862913.6, dated May 27, 2015.
Non-Final Office Action issued in U.S. Appl. No. 14/276,546, dated May 29, 2015.
Office Action issued in Japanese Patent Application No. 2015-046522, mailed Nov. 22, 2016. English translation provided.
Office Action issued in U.S. Appl. No. 15/651,612 dated Aug. 3, 2017.
Office Action issued in Japanese Patent Application No. 2016-200478 dated Aug. 1, 2017. English translation provided.

\* cited by examiner

| RATED VOLTAGE (V) | BREAKDOWN VOLTAGE (V) | TOTAL THICKNESS OF SUBSTRATE W0 (μm) | RESISTIVITY (Ωcm) | AVERAGE CONCENTRATION OF DRIFT LAYER (/cm³) | RATED CURRENT DENSITY (A/cm²) | DISTANCE INDEX L (μm) | FS LAYER WHICH END OF DEPLETION LAYER REACHES INITIALLY: DISTANCE FROM REAR SURFACE X (μm) | | | | | | | | | |
|---|---|---|---|---|---|---|---|---|---|---|---|---|---|---|---|---|
| | | | | | | | W0-0.7L | W0-0.8L | W0-0.9L | W0-1.0L | W0-1.1L | W0-1.2L | W0-1.3L | W0-1.4L | W0-1.5L | W0-1.6L |
| 600 | 700 | 60 | 30 | $1.5 \times 10^{14}$ | 300 | 31.9 | 37.7 | 34.5 | 31.3 | 28.1 | 24.9 | 21.7 | 18.5 | 15.3 | 12.1 | 8.9 |
| 1200 | 1400 | 120 | 60 | $7.7 \times 10^{13}$ | 200 | 58.2 | 79.2 | 73.4 | 67.6 | 61.8 | 55.9 | 50.1 | 44.3 | 38.5 | 32.7 | 26.8 |
| 1700 | 1900 | 170 | 85 | $5.4 \times 10^{13}$ | 150 | 80.8 | 113.4 | 105.3 | 97.3 | 89.2 | 81.1 | 73.0 | 64.9 | 56.9 | 48.8 | 40.7 |
| 3300 | 3500 | 330 | 165 | $2.8 \times 10^{13}$ | 80 | 155.0 | 221.5 | 206.0 | 190.5 | 175.0 | 159.5 | 144.0 | 128.5 | 113.0 | 97.5 | 82.0 |
| 4500 | 4700 | 450 | 225 | $2.0 \times 10^{13}$ | 50 | 223.1 | 293.8 | 271.5 | 249.2 | 226.9 | 204.6 | 182.3 | 160.0 | 137.7 | 115.4 | 93.1 |
| 6500 | 6700 | 650 | 325 | $1.4 \times 10^{13}$ | 30 | 337.3 | 413.9 | 380.1 | 346.4 | 312.7 | 278.9 | 245.2 | 211.5 | 177.7 | 144.0 | 110.3 |

FIG.18

SEMICONDUCTOR DEVICE AND METHOD FOR PRODUCING SEMICONDUCTOR DEVICE

BACKGROUND OF THE INVENTION

A. Field of the Invention

The present invention relates to a semiconductor device and a method for producing a semiconductor device, and more particularly, to a semiconductor device, such as a diode or an insulated gate bipolar transistor (IGBT) including an n− type field stop layer, and a method for producing a semiconductor device.

B. Description of the Related Art

As a semiconductor device used in a power semiconductor device, for example, there is a diode or an IGBT with a breakdown voltage of 400 V, 600 V, 1200 V, 1700 V, 3300 V, or a higher one. The diode or the IGBT is used in a power conversion apparatus such as a converter or an inverter. The power semiconductor device requires good electrical characteristics, such as low loss, high efficiency, and a high breakdown voltage, and low costs. For example, a semiconductor device has been known in which a donor layer which will be an n-type field stop (FS) layer is provided in an n− drift layer to improve switching characteristics. The semiconductor device including the n-type FS layer according to the related art will be described using a diode as an example.

FIG. 6 is a cross-sectional view illustrating a main portion of the diode including the n-type field stop layer according to the related art. In diode 100a shown in FIG. 6, p-type anode region 2 is formed in a first main surface (front surface 1b) of n− semiconductor substrate 1 which will be an n− drift layer that is so thin that a predetermined breakdown voltage is obtained. N+ cathode layer 3 is formed in a second main surface (rear surface 1a) of n− semiconductor substrate 1. Then, a plurality of p-type layers and a metal electrode coming into contact with the p-type layers which form junction edge termination structure 4 are formed in the outer circumference of p-type anode region 2 on the front surface 1b of n+ semiconductor substrate 1 so as to surround p-type anode region 2.

Reference numeral 5 denotes an anode electrode, reference numeral 6 denotes a cathode electrode, reference numeral 8 denotes an insulating film, and reference numeral 9a denotes an n-type FS layer. A donor layer denoted by reference numeral 18a forms n-type FS layer 9a. N-type FS layer 9a is an n-type diffusion layer which has an impurity concentration higher than n− drift layer 1, has a high impurity concentration peak at a relatively deep position (for example, at a depth of 3 μm to several tens of micrometers) in the n− drift layer from rear surface 1a of n− semiconductor substrate 1, and has a large width (a large thickness) in the depth direction of the substrate.

In the diode or the IGBT having the above-mentioned structure, in order to improve the switching characteristics, a method has been known which generates crystal defects in the n− drift layer using electron beam irradiation and controls a carrier lifetime. In addition, in the diode or the IGBT, in order to reduce switching loss, it is necessary to control carrier concentration at a deep position from the front surface 1b to rear surface 1a of n− semiconductor substrate 1.

As a method of controlling the carrier concentration in n− semiconductor substrate 1 which will be an n− drift layer, a method has been known which performs proton implantation capable of forming a deep range in n− semiconductor substrate 1 from rear surface 1a of n− semiconductor substrate 1 at a relatively low acceleration voltage and generates donor layer 18a in an n− silicon substrate, which is n− semiconductor substrate 1, as shown in FIG. 6. This method performs proton implantation for a region including oxygen to form n-type FS layer 9a which is donor layer 18a including the crystal defects formed by the proton implantation.

FIG. 7 is a characteristic diagram illustrating a carrier concentration distribution on the line X1-X2 of FIG. 6. FIG. 7 illustrates the carrier concentration distribution of donor layer 18a which is formed in n− semiconductor substrate 1 by the proton implantation. As shown in FIG. 7, donor layer 18a formed by the proton implantation has an impurity concentration distribution in which impurity concentration has a peak position at a predetermined depth from rear surface 1a of n− semiconductor substrate 1 and is reduced from the peak position to p-type anode region 2 and n+ cathode layer 3. In FIG. 7, the vertical axis is carrier concentration B and the horizontal axis is a depth C from the interface between n+ cathode layer 3 and donor layer 18a (n-type FS layer 9a).

The proton implantation is used to control a lifetime killer, in addition to the generation of donors. A method has been known in which crystal defects serving as the lifetime killers are generated in the semiconductor substrate using the proton implantation. The generation of the crystal defects in the semiconductor substrate by the proton implantation makes it possible to control the carrier lifetime of the diode or the IGBT, but has an adverse effect on electrical characteristics. For example, the breakdown voltage is reduced or the leakage current is increased by the crystal defects. Therefore, it is possible to control the amount of crystal defects for generating donors and the amount of crystal defects which will be the lifetime killers at the same time.

The following Patent Literature 1 discloses heat treatment conditions required to obtain the desired element characteristics in a method of generating donors using proton implantation. The following Patent Literature 2 discloses oxygen concentration required to increase the donor generation rate in the generation of donors by proton implantation.

Patent Literature 1: United States Patent Application, Publication No. 2006/0286753

Patent Literature 2: Pamphlet of PCT International Publication No. 2007/55352

SUMMARY OF THE INVENTION

However, Patent Literature 1 and Patent Literature 2 have the following problems. In order to increase the donor generation rate using proton implantation, it is necessary to appropriately control three elements, that is, hydrogen, oxygen, and crystal defects in the n− drift layer. Patent Literature 1 discloses the degree of recovery of the crystal defects generated during proton implantation by the heat treatment, but does not disclose a method of supplementing the amount of crystal defects to increase the donor generation rate when the crystal defects generated during proton implantation are insufficient. Patent Literature 2 discloses the oxygen concentration required to increase the donor generation rate, but does not disclose a method of appropriately adjusting the amount of crystal defects to increase the donor generation rate.

The present invention provides a semiconductor device and a method for producing a semiconductor device capable of increasing a donor generation rate using proton implantation and improving electrical characteristics, in order to solve the problems of the related art described above.

In order to solve the above-mentioned problems, a method for producing a semiconductor device according to the invention forms a donor layer in a semiconductor substrate using proton implantation and has the following characteristics. First, a crystal defect forming step of generating crystal defects before or after the proton implantation is performed. Then, a donor layer forming step of forming the donor layer using the proton implantation and a first heat treatment is performed.

In the method for producing a semiconductor device according to the invention, the crystal defect forming step may generate the crystal defects such that a predetermined amount of crystal defects remain during the first heat treatment.

In the method for producing a semiconductor device according to the invention, the crystal defect forming step may generate the crystal defects using electron beam irradiation. In the method for producing the semiconductor device according to the invention, the crystal defects which remain in the semiconductor substrate during the first heat treatment may contribute to the formation of the donor layer.

In the method for producing a semiconductor device according to the invention, the crystal defect forming step may perform a second heat treatment to adjust the amount of crystal defects after the crystal defects are formed.

In the method for producing a semiconductor device according to the invention, the first heat treatment may be performed under conditions of a temperature of 350° C. to 550° C. and a processing time of 1 to 10 hours.

In the method for producing a semiconductor device according to the invention, the donor layer may be an n-type field stop layer of a diode or an insulated gate bipolar transistor.

In the method for producing a semiconductor device according to the invention, a processing temperature of the process performed after the first heat treatment may be lower than the temperature of the first heat treatment.

A semiconductor device according to the invention is produced by the above-mentioned method for producing a semiconductor device.

According to the invention, the electron beam irradiation is performed before or after the proton implantation and the amount of crystal defects is optimally controlled during a heat treatment. Therefore, it is possible to increase the donor generation rate. In addition, according to the invention, when the heat treatment for generating donors ends, the crystal defects formed by the electron beam irradiation and the proton implantation are recovered and controlled to an appropriate amount of crystal defects. Therefore, it is possible to improve electrical characteristics. For example, it is possible to increase a breakdown voltage and reduce a leakage current.

According to the semiconductor device and the method for producing a semiconductor device of the invention, it is possible to increase the donor generation rate using proton implantation and improve the electrical characteristics.

BRIEF DESCRIPTION OF THE DRAWINGS

The foregoing advantages and features of the invention will become apparent upon reference to the following detailed description and the accompanying drawings, of which:

FIG. 18 is a table illustrating the position conditions of a field stop layer which a depletion layer reaches initially in the semiconductor device according to the invention;

DETAILED DESCRIPTION OF SPECIFIC EMBODIMENTS

Figure 1A:
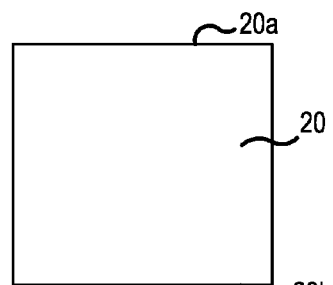
FIGS. 1(a) to 1(h) are cross-sectional views illustrating the sequence of a production process according to Embodiment 1 of the invention.

Hereinafter, a semiconductor device and a method for producing a semiconductor device according to exemplary embodiments of the invention will be described in detail with reference to the accompanying drawings. In the specification and the accompanying drawings, in the layers or regions having "n" or "p" appended thereto, an electron or a hole means a majority carrier, respectively. In addition, symbols "+" and "−" added to n or p mean that impurity concentration is respectively higher and lower than that of the layer or the region without the symbols. In the description of the following embodiments and the accompanying drawings, the same components are denoted by the same reference numerals and the description thereof will not be repeated.

Embodiment 1

Figure 1B:
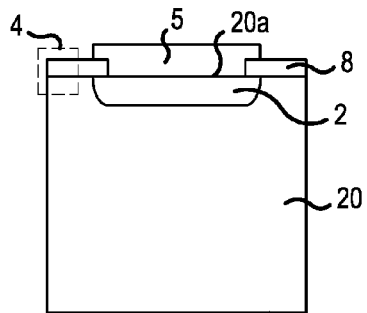
Figure 1C:
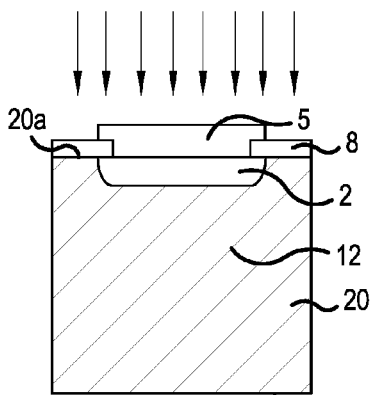
Figure 1D:
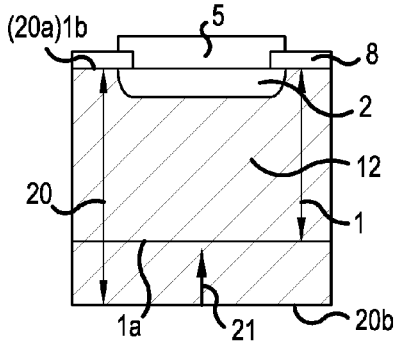
Figure 1E:
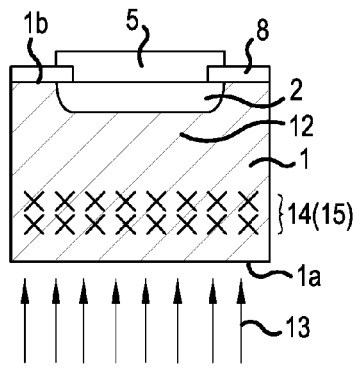

FIG. 1 is a cross-sectional view illustrating the sequence of a production process according to Embodiment 1 of the invention. FIG. 2 is a flowchart illustrating the flow of the production process shown in FIG. 1. Next, a method for producing a semiconductor device according to Embodiment 1 will be described with reference to FIGS. 1 and 2. The semiconductor device manufactured (produced) by the semiconductor device production method according to Embodiment 1 shown in FIG. 1 is diode 100 including n-type field stop (FS) layer 9 illustrated in FIG. 1(h). First, for example, an n-type silicon substrate is prepared as thick $n^-$ semiconductor substrate 20 which is not thinned (FIG. 1(a)).

Then, as illustrated in the processes (1) and (2) of FIG. 2, p-type anode region 2 and anode electrode 5 (metal) which is electrically connected to p-type anode region 2 are formed on a first main surface (front surface 20a) of $n^-$ semiconductor substrate 20, which will be an $n^-$ drift layer, by a general method. In addition, junction edge termination structure 4 (edge portion) which ensures a breakdown voltage and surrounds p-type anode region 2 and insulating film 8 which covers front surface 20a of $n^-$ semiconductor substrate 20 are formed in the outer circumference of p-type anode region 2. The junction edge termination structure 4 includes, for example, a plurality of p-type layers and a metal electrode which comes into contact with the p-type layer, which is not illustrated in the drawings.

(1) in FIG. 2 illustrates a process of forming a front surface structure, such as p-type anode region 2, the p-type layers of junction edge termination structure 4, or insulating film 8, as a surface forming process. (2) in FIG. 2 illustrates a process of forming surface metal, such as anode electrode 5 or the metal electrode of junction edge termination structure 4, as a surface electrode forming process. As illustrated in the process (3) of FIG. 2, for example, a polyimide film, a silicon nitride film ($Si_3N_4$ film), or a laminated film of a silicon nitride film and a polyimide film, which is a surface protective film (not illustrated), is formed on front surface 20a of $n^-$ semiconductor substrate 20. Anode electrode 5 and the surface protective film may be formed after $n^+$ cathode layer 3, which will be described below, is formed (FIG. 1(g)). FIG. 1(b) is a cross-sectional view illustrating this state.

Then, as illustrated in the process of (4) of FIG. 2, electron beam irradiation 11 is performed on front surface 20a of the $n^-$ semiconductor substrate 20 to generate crystal defects (for example, point defects) 12 in the $n^-$ drift layer. FIG. 1(c) is a cross-sectional view illustrating this state. In FIG. 1(c), crystal defects 12 are hatched (which holds for FIGS. 1(d) and 1(e)). Electron beam irradiation 11 may be performed under the conditions of, for example, acceleration energy of about 0.5 MeV to 5 MeV and a dose of about 20 kGy to 3000 kGy. After electron beam irradiation 11, pre-heating (second heat treatment) for adjusting the amount of crystal defects 12 may be performed at a temperature of, for example, about 300° C. to 500° C. for 1 to 10 hours. The pre-heating may not be performed when the amount of crystal defects 12 formed by electron beam irradiation 11 is proper.

Electron beam irradiation 11 (also including pre-heating when the pre-heating is performed to adjust the amount of crystal defects 12) may be performed after grinding 21, which will be described below, is performed for $n^-$ semiconductor substrate 1 (FIG. 1(d)) or after proton implantation 13 (FIG. 1(e)) and before a heat treatment (first heat treatment, FIG. 1(f)) for generating donors. In addition, as a method of generating crystal defects 12, for example, helium irradiation may be performed, instead of electron beam irradiation 11. However, in some cases, a lifetime killer is introduced by electron beam irradiation 11.

Then, as illustrated in the process (5) of FIG. 2, grinding 21 is performed on a second main surface (rear surface 20b) of $n^-$ semiconductor substrate 20 to reduce the thickness to a predetermined value, for example, of about 100 μm. The thin $n^-$ semiconductor substrate after grinding 21 is denoted by reference numeral 1. FIG. 1(d) is a cross-sectional view illustrating this state. Then, rear surface 1a of the thin $n^-$ semiconductor substrate 1 is cleaned.

Then, as illustrated in the process (6) of FIG. 2, proton implantation 13 is performed on rear surface 1a of n− semiconductor substrate 1 to introduce hydrogen (H) atoms 14 and crystal defects 15 into $n^-$ semiconductor substrate 1. FIG. 1(e) is a cross-sectional view illustrating this state. The conditions of proton implantation 13 may be, for example, an acceleration energy of 0.4 MeV or more and an implantation dose of about $1\times10^{13}/cm^2$ to $5\times10^{14}/cm^2$. The amount of crystal defects in $n^-$ semiconductor substrate 1 is determined by crystal defects 15 formed by proton implantation 13 and crystal defects 12 (including pre-heating when the pre-heating is performed to adjust the amount of crystal defects 12) formed by electron beam irradiation 11.

As such, after proton implantation 13, $n^-$ semiconductor substrate 1 includes crystal defects 12 formed by electron beam irradiation 11, hydrogen atoms 14 and crystal defects 15 formed by proton implantation 13, and oxygen (O) atoms (not illustrated) in the crystal of $n^-$ semiconductor substrate 1. In FIG. 1(e), hydrogen atoms 14 and crystal defects 15 are represented by the same mark x (which holds for FIG. 11(e)). However, the concentration of the oxygen atoms in $n^-$ semiconductor substrate 1 is not particularly limited.

Then, as illustrated in the process (7) of FIG. 2, a heat treatment (hereinafter, referred to as a heat treatment for generating donors) is performed to ionize hydrogen atoms 14 introduced into $n^-$ semiconductor substrate 1 and to generate donors. The generation of the donors is accelerated by the heat treatment and donor layer 18 is formed in rear surface 1a of $n^-$ semiconductor substrate 1. FIG. 1(f) is a cross-sectional view illustrating this state. Donor layer 18 becomes n-type FS layer 9 of diode 100 and becomes a region with a peak higher than that of the carrier concentration of $n^-$ semiconductor substrate 1. N-type FS layer 9 will be described below. The state of a semiconductor crystal during the generation of the donors will be described below.

It is important that the temperature of the heat treatment for forming donor layer 18 is sufficiently low to completely recover crystal defects 12 and 15. Specifically, the heat treatment for forming donor layer 18 may be performed at a temperature of 350° C. to 550° C. for a processing time of 1 to 10 hours. The reason is as follows. When the heat treatment conditions for forming donor layer 18 are greater than the above-mentioned values (the temperature is higher than 550° C. and the processing time is more than 10 hours), the amount of crystal defects 12 and 15 is small during the generation of the donors and donor layer 18 is insufficiently formed.

When the heat treatment conditions for forming donor layer 18 are less than the above-mentioned values (the temperature is lower than 350° C. and the processing time less than 1 hour), the donors are insufficiently generated and donor layer 18 is insufficiently formed. In addition, when the heat treatment ends, the recovery of crystal defects 12 and 15 is insufficient and a large amount of crystal defects 12 and 15 remain. Therefore, there are a large amount of lifetime killers in the n⁻ drift layer, which causes a reduction in breakdown voltage or an increase in leakage current. The preferred conditions of the heat treatment for generating donor layer 18 in a good state are, for example, a temperature of about 380° C. to 450° C. and a processing time of about 3 to 7 hours.

As such, during the heat treatment for generating donors, it is important that crystal defects 12 and 15 formed by electron beam irradiation 11 or proton implantation 13 are not completely recovered, but some of crystal defects 12 and 15 remain. The remaining crystal defects 12 and 15 contribute to accelerating the generation of donors by protons. When the heat treatment for generating donors ends, it is important to recover crystal defects 12 and 15 such that an appropriate amount of crystal defects 12 and 15 remain in the n⁻ drift layer.

Therefore, the conditions are that crystal defects 12 and 15 formed by proton implantation 13 or electron beam irradiation 11 remain in the n⁻ drift layer during the heat treatment for generating donors. In addition, after the heat treatment for generating donors ends, it is preferable that crystal defects 12 and 15 be recovered and an appropriate amount of crystal defects 12 and 15 remain in the n⁻ drift layer such that desired electrical characteristics are obtained, in terms of breakdown voltage, leakage current, on-voltage, and switching characteristics.

Then, as illustrated in the process of FIG. 2(8), after n-type impurity ions, such as phosphorus (P) ions, are implanted into rear surface 1a of n⁻ semiconductor substrate 1, for example, laser annealing is performed to activate the n-type impurity ions, thereby forming an n⁺ cathode layer 3. FIG. 1(g) is a cross-sectional view illustrating this state. Then, as illustrated in the process of FIG. 2(9), a cathode electrode 6 is formed on rear surface 1a of n⁻ semiconductor substrate 1. In this way, diode 100 illustrated in FIG. 1(h) is completed. After cathode electrode 6 is formed, a heat treatment may be performed on cathode electrode 6, if necessary.

Figure 1F:
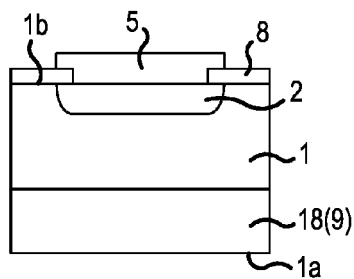
Figure 1G:
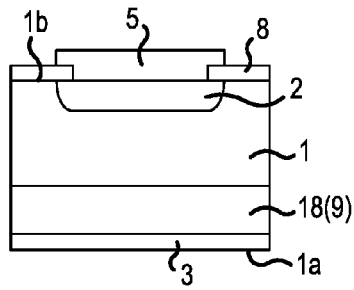
Figure 1H:
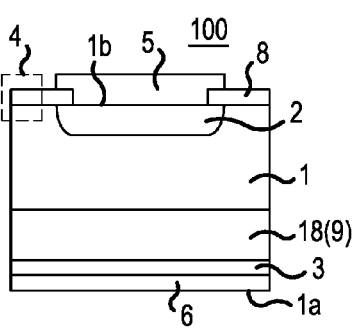
Figure 2:
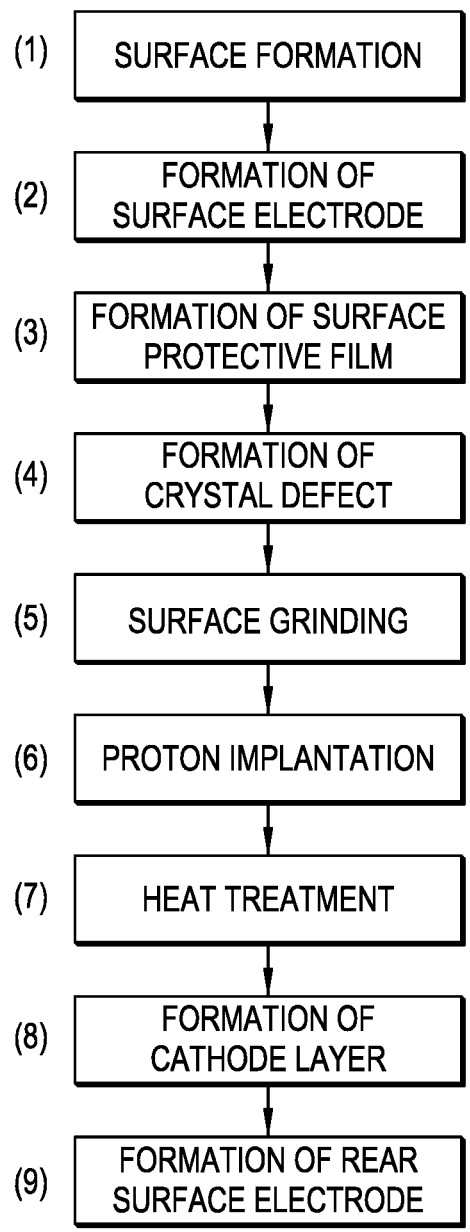
FIG. 2 is a flowchart illustrating the flow of the production process shown in FIG. 1.

In the semiconductor device production method according to Embodiment 1, the concentration of crystal defects 12 (FIG. 1(c)) formed by electron beam irradiation 11 is reduced by the heat treatment for generating donors (FIG. 1(f)) and the thermal activation process for forming n⁺ cathode layer 3 (FIG. 1(g)), but crystal defects 12 remain without being completely recovered. Therefore, the lifetime of minority carriers in the n⁻ drift layer is equal to or less than 10 μs. In diode 100, in order to reduce the reverse recovery time, a heat treatment may be performed under the conditions that crystal defects 12 formed by electron beam irradiation 11 can remain and the lifetime of the carriers in the n⁻ drift layer may be in the range of about 0.1 μs to 1 μs. In this case, for example, after electron beam irradiation 11, a heat treatment may be performed under the conditions of a temperature of 350° C. to 380° C. and a processing time of about 0.5 to 2 hours.

Figure 3:
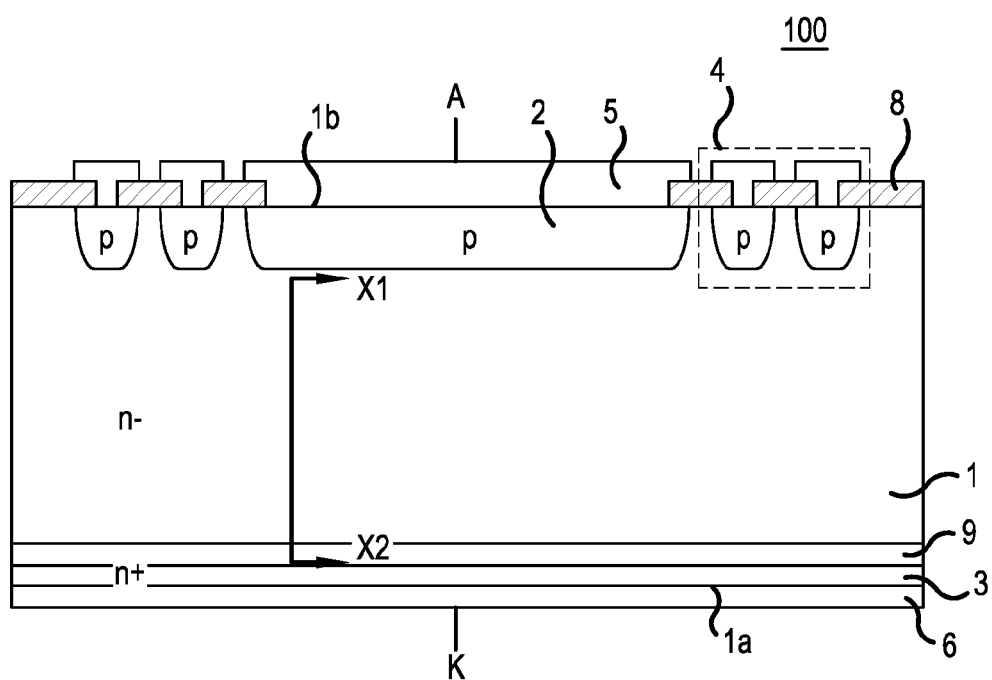
FIG. 3 is a cross-sectional view illustrating a main portion of a semiconductor device according to Embodiment 1 of the invention which is produced by the production method illustrated in FIG. 1.

Next, FIG. 3 is a cross-sectional view illustrating a main portion of diode 100 produced by the semiconductor device production method according to Embodiment 1. FIG. 3 is a cross-sectional view illustrating the main portion of the semiconductor device according to Embodiment 1 produced by the production method illustrated in FIG. 1. The semiconductor device according to Embodiment 1 illustrated in FIG. 3 is diode 100 with n-type FS layer 9 whose donor generation rate is improved by electron beam irradiation 11 illustrated in FIG. 1(h).

Figure 6:
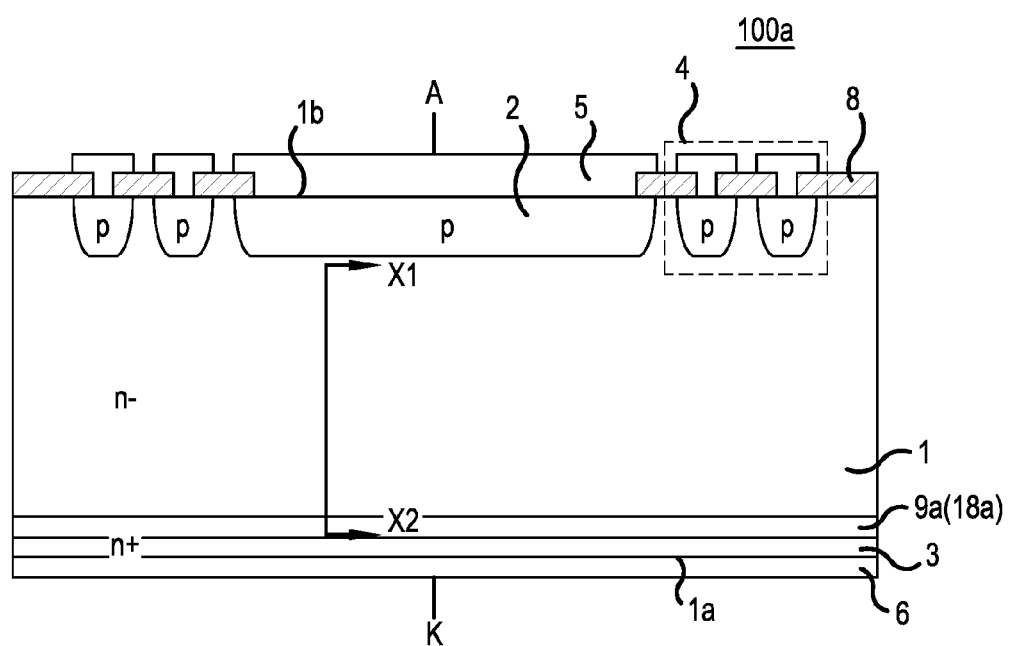
FIG. 6 is a cross-sectional view illustrating a main portion of a diode including an n-type field stop layer according to the related art.
Figure 7:
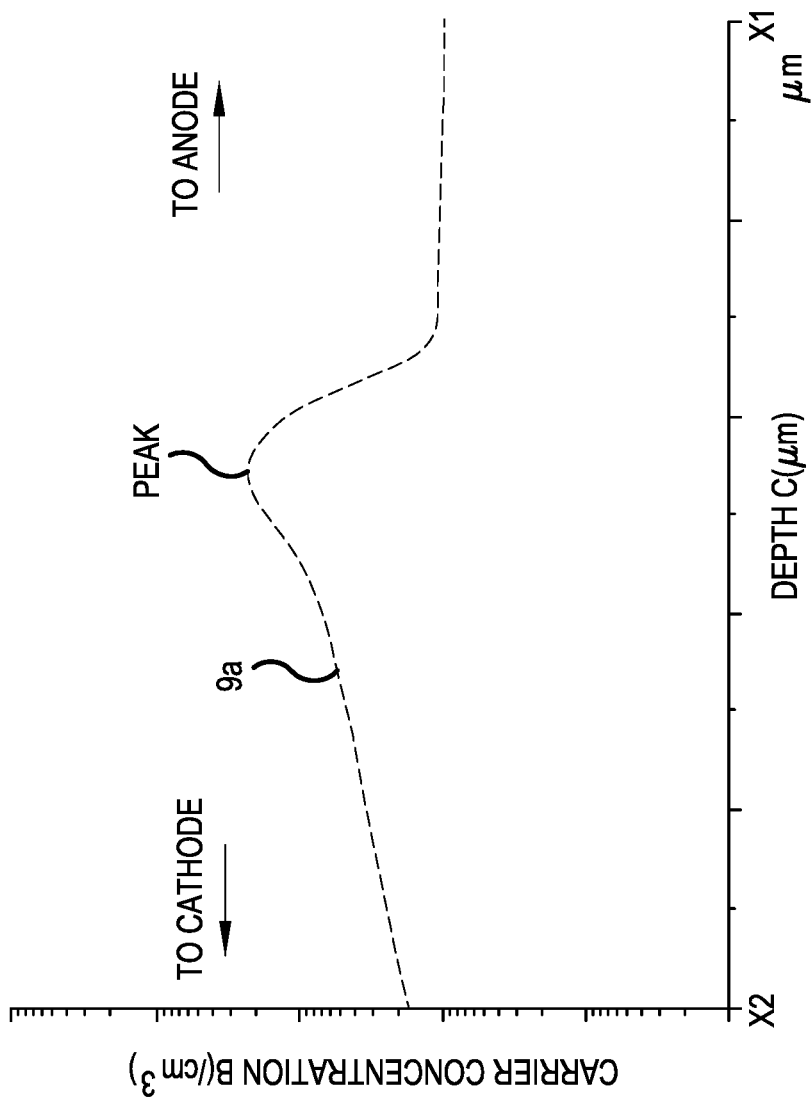
FIG. 7 is a characteristic diagram illustrating a carrier concentration distribution on the line X1-X2 of FIG. 6.

Diode 100 according to Embodiment 1 illustrated in FIG. 3 differs from diode 100a according to the related art illustrated in FIG. 6 in that it includes n-type FS layer 9 (donor layer 18) in which crystal defects 12 are additionally formed by electron beam irradiation 11, instead of n-type FS layer 9a (donor layer 18a) of diode 100a according to the related art illustrated in FIG. 6.

Figure 4:
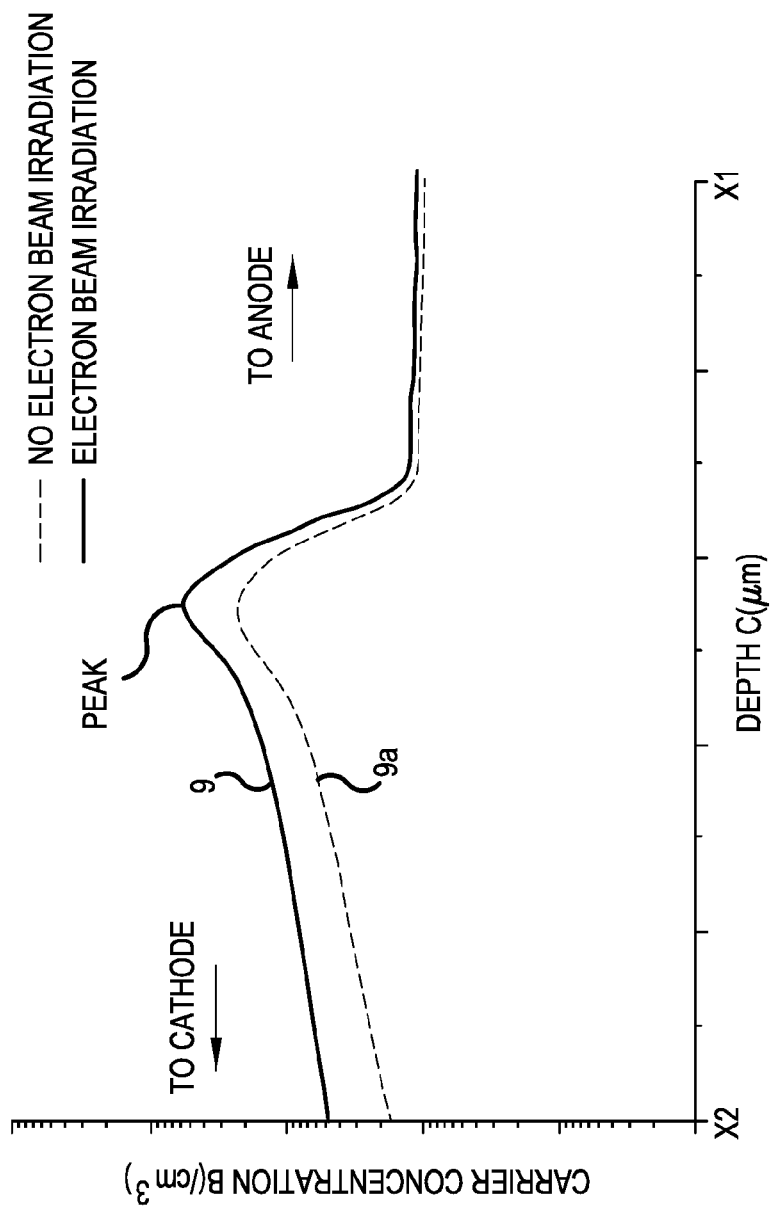
FIG. 4 is a characteristic diagram illustrating electron beam irradiation and a carrier concentration distribution on the line X1-X2 of FIG. 3.

Donor layer 18 which will be n-type FS layer 9 is formed in n⁻ semiconductor substrate 1 by electron beam irradiation 11 and proton implantation 13, as described above, and crystal defects 12 and 15 remaining in n⁻ semiconductor substrate 1 contribute to the generation of donors during the heat treatment. In this way, it is possible to obtain diode 100 including n-type FS layer 9 with a higher donor generation rate than that in the related art. FIG. 4 illustrates the carrier concentration distribution of n-type FS layer 9. FIG. 4 is a characteristic diagram illustrating the relation between electron beam irradiation and a carrier concentration distribution on the line X1-X2 of FIG. 3.

As illustrated in FIG. 4, n-type FS layer 9 has an impurity concentration distribution in which impurity concentration has a peak position at a predetermined depth from rear surface 1a of n⁻ semiconductor substrate 1 and is reduced from the peak position to p-type anode region 2 and n⁺ cathode layer 3. In addition, n-type FS layer 9 has a carrier concentration distribution in which the donor generation rate is higher than that of n-type FS layer 9a of diode 100a according to the related art by crystal defects 12 formed by electron beam irradiation 11. In FIG. 4, the vertical axis is carrier concentration B and the horizontal axis is a depth C from the interface between n⁺ cathode layer 3 and n-type FS layer 9. In FIG. 4, 'no electron beam irradiation' represented by a dotted line indicates diode 100a according to the related art illustrated in FIG. 6 and 'electron beam irradiation' represented by a solid line indicates diode 100 according to Embodiment 1 of the invention.

As represented by the solid line in FIG. 4, a method of adding crystal defects 12 using electron beam irradiation 11 can improve the donor generation rate. For example, the donor generation rate in the related art is 1%, but the donor generation rate in this embodiment can increase about 3%. That is, the carrier concentration is about three times higher than that in the related art. As a result, for example, when a donor peak concentration of $1 \times 10^{15}/cm^3$ is needed, the amount of hydrogen implanted (the amount of proton implanted) can be reduced to about one-third of the amount of hydrogen implanted in the related art. In addition, the amount of oxygen in the n⁻ semiconductor substrate can be less than that in the related art. As such, since the amount of proton implanted can be reduced, the amount of crystal defects can be reduced and mobility can be improved. As a result, it is possible to reduce the on-voltage, increase the breakdown voltage, and reduce the leakage current.

In the semiconductor device production method according to Embodiment 1, in some cases, after anode electrode 5 of the semiconductor device (diode 100) is formed (after the processes of FIG. 1(g) or 1(h)), a copper or nickel gold plating layer for soldering is formed on anode electrode 5. In this case, the temperature when the plating layer is formed on anode electrode 5 needs to be lower than the temperature of the heat treatment for generating the donors. When a lead frame, which is an external lead terminal, is soldered to the plating layer, a soldering temperature needs to be lower than the temperature of the heat treatment for generating the donors. When the surface protective film is formed after the heat treatment for generating donors, the temperature of the heat treatment for forming the surface protective needs to be lower than the temperature of the heat treatment for generating donors.

That is, the formation temperature of each portion formed after the heat treatment for generating the donors needs to be lower than the temperature of the heat treatment for generating the donors. The reason is that, when the formation temperature of each portion formed after the heat treatment for generating the donors is higher than the temperature of the heat treatment for generating the donors, the donors generated by the heat treatment for generating the donors are relaxed and return to a state close to a normal crystal state and the diffusion concentration distribution of n-type FS layer 9 deteriorates.

Figure 5A:
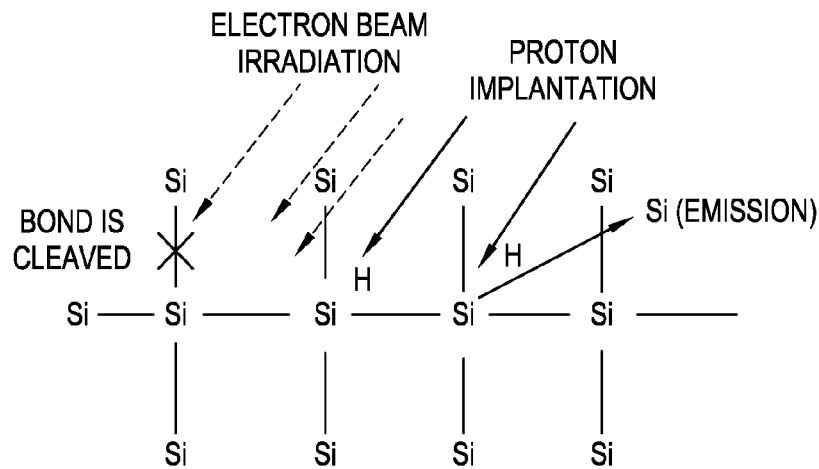
FIGS. 5(a) to 5(c) are diagrams illustrating the state of a semiconductor crystal when donors are generated in the semiconductor device production method according to Embodiment 1.
Figure 5B:
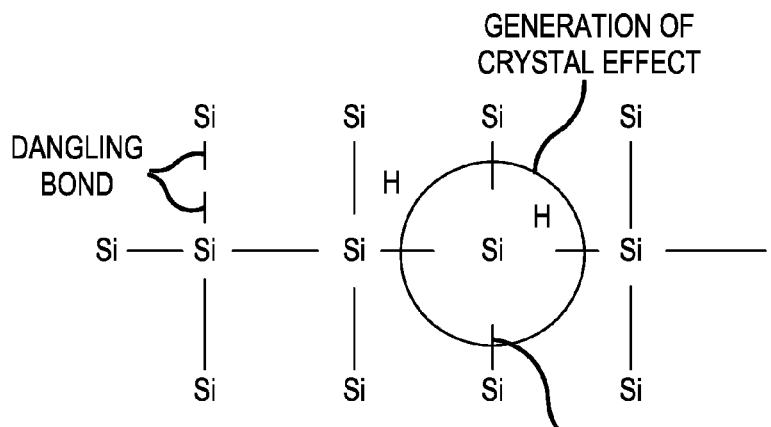
Figure 5C:
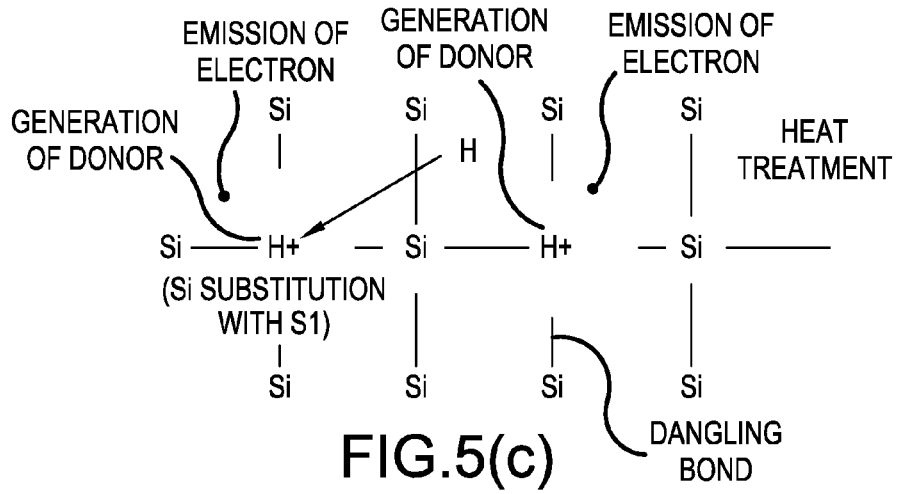

Next, the state of the semiconductor crystal during the generation of the donors will be described using a case in which $n^-$ semiconductor substrate 1 is, for example, a silicon (Si) substrate as an example. FIG. 5 is a diagram illustrating the state of the semiconductor crystal during the generation of the donors in the semiconductor device production method according to Embodiment 1. For example, the bond between silicon atoms in a silicon crystal is cleaved and the silicon atoms in the silicon crystal are emitted by electron beam irradiation 11 and proton implantation 13. As a result, crystal defects are generated. In addition, the hydrogen ions ($H^+$) introduced by proton implantation 13 enter the silicon crystal, capture free electrons in the silicon crystal, and become interstitial hydrogen (H) atoms (FIG. 5($a$)).

The crystal defects generated by electron beam irradiation 11 and proton implantation 13 have silicon atom dangling bonds (FIG. 5($b$)). In a portion in which the bond between the silicon atoms is cleaved, the heat treatment causes the silicon atom to be substituted with the hydrogen atom through the dangling bond. In addition, the emitted silicon atom is substituted with the hydrogen atom. The substituted hydrogen atom emits an electron, has positive charge, is ionized into a hydrogen ion ($H^+$), and becomes a donor with an extra electron like a group 15 element, such as phosphorus (P) (FIG. 5($c$)). Here, the involvement of oxygen will not be described.

As such, a heat treatment is performed, with three elements, that is, a crystal defect, hydrogen, and oxygen included in the silicon substrate, to generate donors. It is important that three elements, that is, a crystal defect, hydrogen, and oxygen are appropriately present in order to improve the donor generation rate. In the invention, in particular, when the amount of crystal defects formed by proton implantation is insufficient, it is possible to increase the amount of crystal defects using electron beam irradiation 11 before the heat treatment for generating donors. Therefore, it is possible to ensure the amount of crystal defects required to generate donors and improve the donor generation rate. For this reason, the invention is useful.

As described above, according to Embodiment 1, electron beam irradiation is performed to generate crystal defects in the $n^-$ semiconductor substrate. In addition, the crystal defects in the $n^-$ semiconductor substrate are not completely recovered, but some of the crystal defects remain during the heat treatment for generating donors which is performed after proton implantation. Therefore, it is possible to improve the donor generation rate, as compared to the related art. According to Embodiment 1, when the heat treatment for generating donors ends, the crystal defects formed by electron beam irradiation and proton implantation are recovered and are controlled such that the amount of crystal defects is appropriate. Therefore, it is possible to improve electrical characteristics. That is, for example, it is possible to improve the breakdown voltage and reduce the leakage current.

Embodiment 2

FIG. 8 is a characteristic diagram illustrating a difference in carrier concentration distribution when electron beam irradiation is performed and when no electron beam irradiation is performed. FIG. 8($a$) is a diagram illustrating the comparison between an example according to the invention in which electron beam irradiation is performed (hereinafter, referred to as an example) and an example according to the related art in which no electron beam irradiation is performed (hereinafter, referred to as Conventional example 1). FIG. 8($b$) is a diagram illustrating the comparison between an example in which no electron beam irradiation is performed and Rp2 is equal to or more than 0.5Rp1 (hereinafter, referred to as Conventional example 2) and an example in which no electron beam irradiation is performed and Rp2 is less than 0.5Rp1 (Conventional example 1). Here, Rp1 and Rp2 are proton implantation ranges and are average ranges from rear surface 1$a$ of $n^-$ semiconductor substrate 1. The average range means the depth of a peak concentration position of the impurity concentration distribution of n-type FS layer 9, which is represented by a Gaussian distribution, from the rear surface of the substrate. Specifically, the average range is a depth from the rear surface of the substrate to the proton peak position.

A semiconductor device production method according to Embodiment 2 differs from the semiconductor device production method according to Embodiment 1 in that proton implantation is performed a plurality of times (hereinafter, referred to as in a plurality of stages). Specifically, first proton implantation (first stage) is performed in which the deepest position from rear surface 1$a$ of $n^-$ semiconductor substrate 1 is a range Rp1 and then second proton implantation (second stage) is performed in which a range Rp2 is less than half of the range Rp1 of the first proton implantation. In this case, the range Rp2 of the second proton implantation is less than 0.5Rp1 in both this example and Conventional example 1 (Rp2<0.5Rp1). On the other hand, in Conventional example 2, the second proton implantation is performed in a range Rp2b equal to or more than 0.5Rp1 (Rp2b≥0.5Rp1). In this example and Conventional examples 1 and 2, third proton implantation (third stage) in which a range Rp3 is about 5 μm is performed. In this example and Conventional examples 1 and 2, electron beam irradiation was performed in the same sequence as that in Embodiment 1 (FIG. 2(4)).

First, as illustrated in FIG. 8($b$), among a plurality of (three) proton implantation operations, in Conventional example 2 in which the range Rp2b in the second stage is equal to or more than 0.5Rp1 with respect to the first stage with the deepest range, carrier concentration is not reduced in a region (hereinafter, referred to as a region A) between the first stage (the deepest range Rp1) and the second stage (Rp2b). However, in Conventional example 1 in which the range Rp2 in the second stage is less (shallower) than 0.5Rp1, the carrier concentration is greatly reduced in the region A. The reason is as follows. When spreading resistance is converted into resistivity (carrier concentration), a spread-resistance profiling (SR) method uses the theoretical value (in the case of an n type, the electron mobility is about 1360 cm$^2$/(Vs)) of silicon carrier mobility. That is, since implantation damage (various crystal defects occur in silicon and disorder occurs) is introduced by the proton implantation, the actual mobility is greatly reduced. The reduction in the mobility occurs in Conventional example 1 illustrated in FIG. 8 and apparently, carrier concentration is reduced. As such, it is presumed that, when the range Rp2 in the second stage is less than 0.5Rp1, the reduction in the mobility in the region A is not recovered by the implanted hydrogen and carrier concentration is greatly reduced.

Figure 8A:
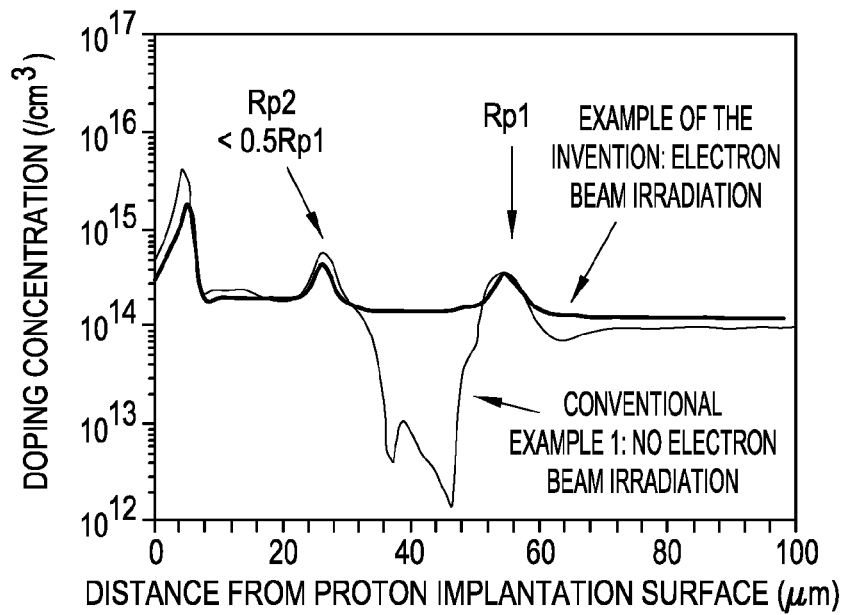
FIGS. 8(a) and 8(b) are characteristic diagrams illustrating a difference in the carrier concentration distribution when electron beam irradiation is performed and when no electron beam irradiation is performed.

As in Example 1, electron beam irradiation 11 is performed to introduce a large amount of point defects (vacancies and divacancies) before the first to third proton implantation operations. The result illustrated in FIG. 8(a) illustrates that, even when the range Rp2 in the second stage is less than 0.5Rp1, carrier concentration is sufficiently recovered.

As described above, according to Embodiment 2, it is possible to obtain the same effect as that in Embodiment 1.

Embodiment 3

Figure 9:
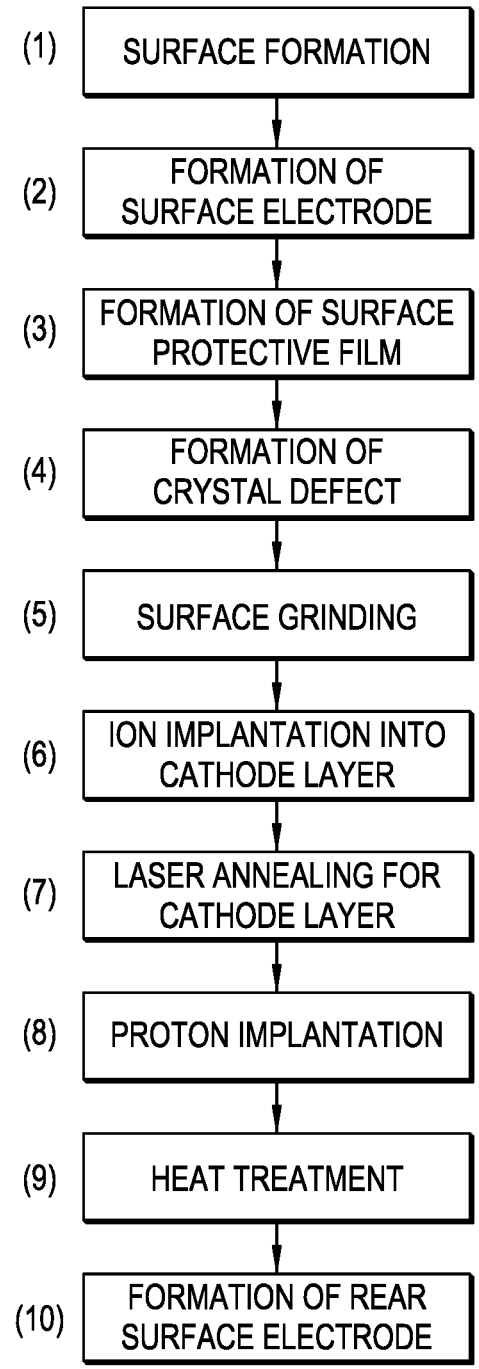
FIG. 9 is a flowchart illustrating the flow of a semiconductor device production process according to Embodiment 3.

FIG. 9 is a flowchart illustrating the flow of a semiconductor device production process according to Embodiment 3. The semiconductor device production method according to Embodiment 3 is a modification of the semiconductor device production method according to Embodiment 1 in which the order of processes before and after proton implantation is changed. The semiconductor device production method according to Embodiment 3 differs from the semiconductor device production method according to Embodiment 1 in that, after a rear surface of an n⁻ semiconductor substrate is ground and before proton implantation, ion implantation for forming a cathode layer is performed and the cathode layer is activated by laser annealing. The other processes in the semiconductor device production method according to Embodiment 3 are the same as those in the semiconductor device production method according to Embodiment 1.

Specifically, first, similarly to Embodiment 1, a surface forming process (FIG. 9(1)) to a rear surface grinding process (FIG. 9(5)) are performed. Then, ion implantation for forming the cathode layer is performed (FIG. 9(6)). The ion implantation for forming the cathode layer may be performed under the conditions of, for example, a phosphorus dose of 1×10$^{15}$/cm$^2$ and an acceleration energy of 50 keV. Then, the cathode layer is activated by laser annealing (FIG. 9(7)). The ion implantation for forming the cathode layer and the activation of the cathode layer by laser annealing may be performed by the same method as that in Embodiment 1 except that they are performed at a different time from those in Embodiment 1. Then, similarly to Embodiment 1, proton implantation is performed on a rear surface (ground surface) of the n⁻ semiconductor substrate and a heat treatment for generating donors is performed. Then, the subsequent processes are performed (FIGS. 9(8) to 9(10)) to complete diode 100 illustrated in FIG. 3.

As described above, according to Embodiment 3, it is possible to obtain the same effect as that in Embodiment 1.

Embodiment 4

Figure 10:
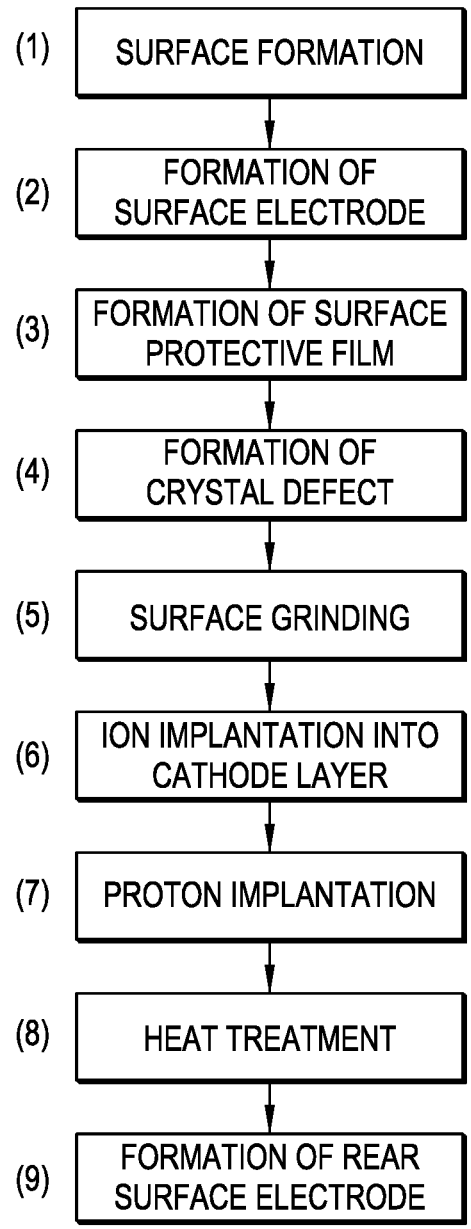
FIG. 10 is a flowchart illustrating the flow of a semiconductor device production process according to Embodiment 4.

FIG. 10 is a flowchart illustrating the flow of a semiconductor device production process according to Embodiment 4. A semiconductor device production method according to Embodiment 4 differs from the semiconductor device production method according to Embodiment 3 in that the activation of a cathode layer by laser annealing is performed together with a heat treatment for generating donors which is performed after proton implantation. That is, in Embodiment 4, laser annealing for activating the cathode layer is not performed immediately after ion implantation (FIG. 10(6)) for forming a cathode layer, but proton donors and the cathode layer are activated at the same time by a heat treatment (FIG. 10(8)) after proton implantation (FIG. 10(7)). The other processes in the semiconductor device production method according to Embodiment 4 are the same as those in the semiconductor device production method according to Embodiment 3.

As described above, according to Embodiment 4, it is possible to obtain the same effect as that in Embodiment 1. In addition, according to Embodiment 4, it is possible to omit the laser annealing process, reduce an annealing device introduction cost, and improve throughput, in addition to obtaining the same effect as that in Embodiment 1.

Embodiment 5

In Embodiment 1, electron beam irradiation is performed to introduce the point defects in the depth direction of the substrate. As an FZ substrate doping method, a method has been known which performs nuclear transmutation (Si→phosphorus) using neutron beams to dope a drift layer uniformly at a low concentration. A semiconductor device production method according to Embodiment 5 differs from the semiconductor device production method according to Embodiment 1 in that crystal defects 42 are generated by neutron beam irradiation. Crystal defects 42 generated by the neutron beam irradiation are used to accelerate the change of protons to donors.

FIG. 11 is a cross-sectional view illustrating the sequence of a production process according to Embodiment 5 of the invention. First, a neutron beam (not illustrated) is irradiated to an ingot produced by a non-doped floating zone (FZ) method to form FZ wafer (n⁻ semiconductor substrate) 40 with a resistivity of, for example, 50 Ωcm (FIG. 11(a)). Then, a front surface structure (for example, a p anode layer) or surface metal (for example, an anode electrode 5) is formed on front surface 40a of FZ wafer 40 at a temperature lower than 1000° C. (FIG. 11(b)). The reason why the front surface structure or the surface metal is formed at a temperature lower than 1000° C. is that crystal defects 42 generated by the neutron beam irradiation remain in FZ wafer 40. In FIG. 11(a), crystal defects 42 generated by the neutron beam irradiation are hatched (which holds for FIGS. 11(b) to 11(e)). Then, a passivation film (not illustrated) made of, for example, polyimide is formed on front surface 40a of FZ wafer 40 and the surface forming process ends (FIG. 11(c)).

Figure 11A:
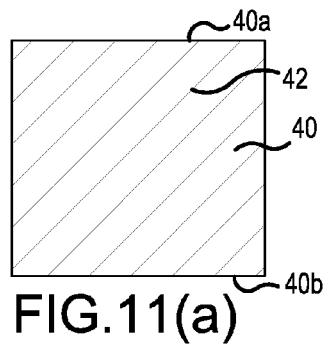
FIGS. 11(a) to 11(h) are cross-sectional views illustrating the sequence of a production process according to Embodiment 5 of the invention.
Figure 11B:
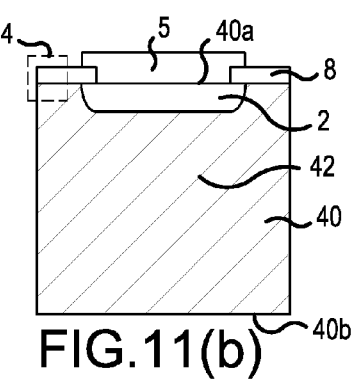
Figure 11C:
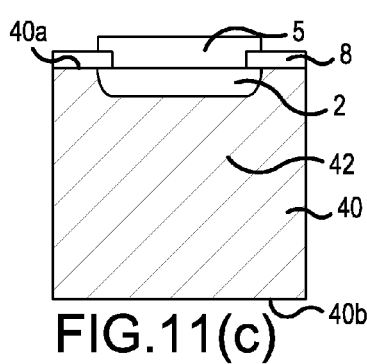
Figure 11D:
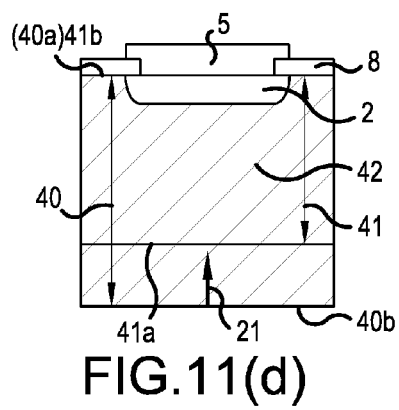
Figure 11E:
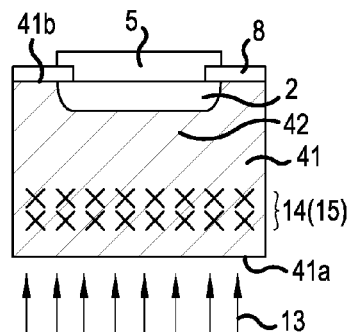

Then, similarly to Embodiment 1, grinding 21 is performed on rear surface 40b of FZ wafer 40 to reduce the thickness of FZ wafer 40 (FIG. 11(d)). Hereinafter, the FZ wafer thinned by grinding 21 is denoted by reference numeral 41. Then, proton implantation is performed on the ground rear surface 41a of the FZ wafer 41 once or a plurality of times (FIG. 11(e)). When the proton implantation is performed once, it is the same as proton implantation 13 in Embodiment 1. When the proton implantation is performed a plurality of times, it is the same as that the proton implantation in Embodiment 2. FIG. 11(e) illustrates a state in which hydrogen atoms 14 and crystal defects 15 are introduced into FZ wafer 41 by one proton implantation operation 13.

Figure 11F:
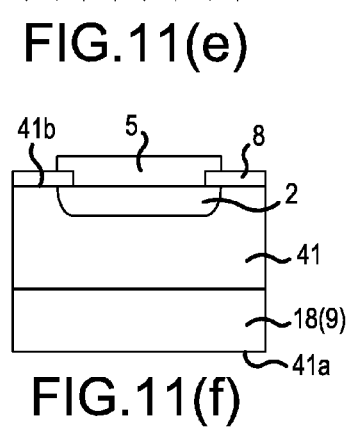
Figure 11G:
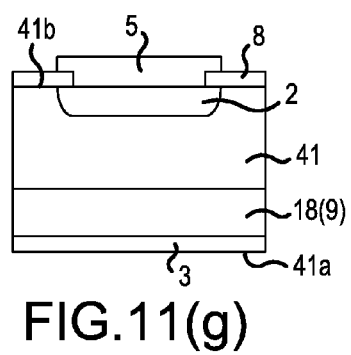
Figure 11H:
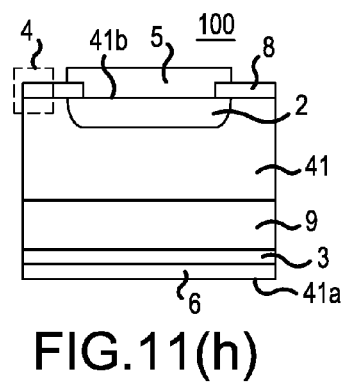

Then, a heat treatment for generating donors is performed to change (activate) hydrogen atoms 14 into donors using protons (FIG. 11(f)). In this way, the same donor layer 18 as that in Embodiment 1 is formed. Then, similarly to Embodiment 1, n+ cathode layer 3 is formed on rear surface 41a of FZ wafer 41 (FIG. 11(g)) and a rear surface electrode, which will be cathode electrode 6, is formed by, for example, sputtering. In this way, diode 100 illustrated in FIG. 3 is completed (FIG. 11(h)). In FIG. 3, FZ wafer 41 is denoted by reference numeral 1.

Figure 12:
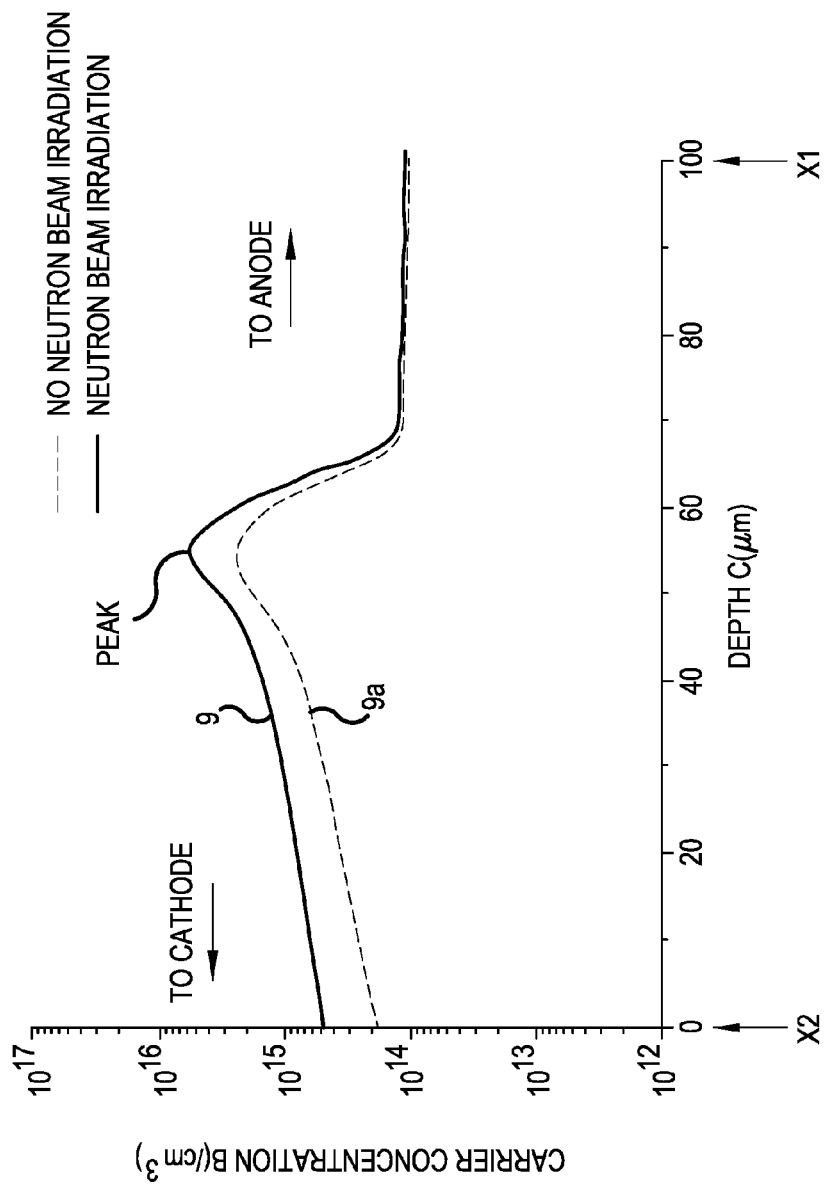
FIG. 12 is a characteristic diagram illustrating the relation between neutron beam irradiation and a carrier concentration distribution on the line X1-X2 of FIG. 3.

FIG. 12 is a characteristic diagram illustrating the relation between neutron beam irradiation and a carrier concentration distribution on the line X1-X2 of FIG. 3. FIG. 12 is a diagram illustrating the comparison between carrier concentrations after the completion of processes when a neutron beam is irradiated (diode 100 according to Embodiment 5 of the invention) and when no neutron beam is irradiated (diode 100a according to the related art illustrated in FIG. 6). The carrier concentration of n-type FS layer 9a when a neutron beam is irradiated is less than that when an electron beam is irradiated (see FIG. 4). However, the generation of donors is accelerated by crystal defects (point defects) 42 generated by the neutron beam irradiation and the carrier concentration is higher than that in diode 100a according to the related art.

As described above, according to Embodiment 5, it is possible to obtain the same effect as that in Embodiment 1.

Embodiment 6

In Embodiment 6, the preferred proton peak position in the first proton irradiation operation among a plurality of proton irradiation operation in the semiconductor device production method according to Embodiment 2, particularly, the reason why the range Rp1 in the first stage is preferably equal to or more than a depth of 15 μm from the rear surface of the substrate will be described below.

Figure 16:
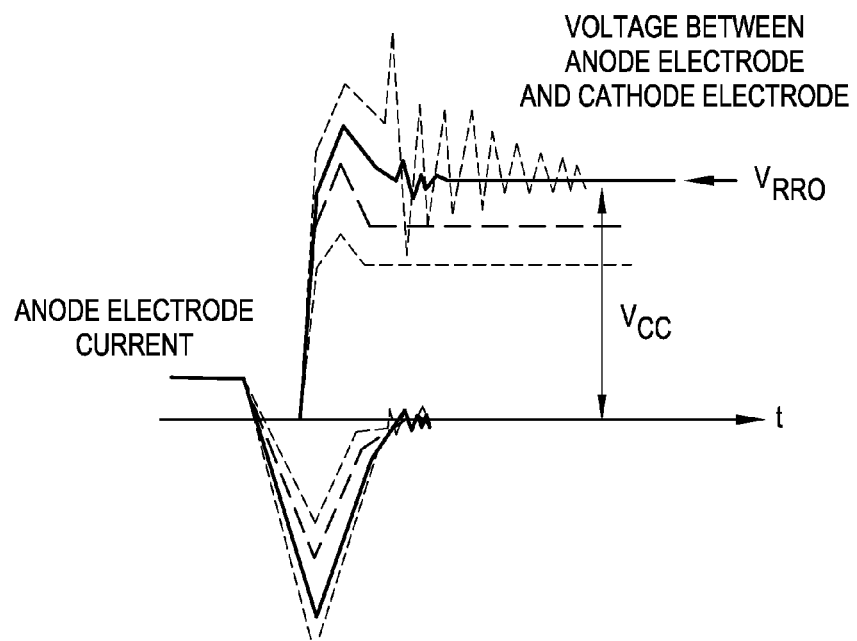
FIG. 16 is an oscillation waveform during the reverse recovery of a general diode.

FIG. 16 illustrates an oscillation waveform during the reverse recovery of a general diode. When an anode current is equal to or less than one-tenth of the rated current, in some cases, the amount of carriers accumulated is small and oscillation occurs before the reverse recovery ends. The anode current is fixed to a certain value and the diode is reversely recovered by a different power supply voltage $V_{CC}$. In this case, when the power supply voltage $V_{CC}$ is greater than a predetermined value, it is greater than the peak value of a general overshoot voltage in the voltage waveform between the cathode and the anode and an additional overshoot occurs. The additional overshoot (voltage) serves as a trigger and the subsequent waveform oscillates. When the power supply voltage $V_{CC}$ is greater than the predetermined value, the additional overshoot voltage further increases and the subsequent oscillation amplitude also increases. As such, a threshold voltage at which the voltage waveform starts to oscillate is referred to as an oscillation start threshold value $V_{RRO}$. When the oscillation start threshold value $V_{RRO}$ increases, the diode does not oscillate during reverse recovery, which is preferable.

The oscillation start threshold value $V_{RRO}$ depends on the first proton peak position that a depletion layer (strictly, a space charge region including holes) which is spread from the pn junction between a p-type anode layer and an n− drift layer of the diode to the n− drift layer reaches initially, among a plurality of proton peak positions. The reason is as follows. When the depletion layer is spread from the p-type anode layer in the front surface to the n− drift layer surface during reverse recovery, the end of the depletion layer reaches the first FS layer (field stop layer) and the spreading of the depletion layer is suppressed. The sweep of the accumulated carriers is weakened. As a result, the depletion of the carriers is suppressed and oscillation is suppressed.

During reverse recovery, the depletion layer is spread from the pn junction between the p anode layer and the n− drift layer toward the cathode electrode in the depth direction. Therefore, the peak position of the FS layer which the end of the depletion layer reaches initially is the FS layer which is closest to the pn junction. Here, the thickness of the n− semiconductor substrate (the thickness of a portion interposed between the anode electrode and the cathode electrode) is W0 and the depth of the peak position of the FS layer which the end of the depletion layer reaches first from the interface between the cathode electrode and the rear surface of the n− semiconductor substrate (hereinafter, referred to as a distance from the rear surface) is X. A distance index L is introduced. The distance index L is represented by the following Expression (1).

$$L = \sqrt{\frac{\varepsilon_S V_{rate}}{\left(\frac{J_F}{qv_{sat}} N_d\right)}} \qquad \text{Expression (1)}$$

The distance index L represented by the above-mentioned Expression (1) is an index indicating the distance of the end (depletion layer end) of the depletion layer (exactly, a space charge region), which is spread from the pn junction to the n− drift layer, from the pn junction during reverse recovery when a voltage between the cathode and the anode is $V_{CE}$ and a power supply voltage is $V_{CC}$. In a fraction in the square root, a denominator indicates the space charge density of the space charge region (simply, the depletion layer) during reverse recovery. The known Poisson equation is represented by $divE = \rho/\varepsilon$, in which E is electric field intensity, $\rho$ is space charge density, and $\rho = q(p-n+N_d-N_a)$ is established. Here, q is an elementary charge, p is hole concentration, n is electron concentration, $N_d$ is donor concentration, $N_a$ is acceptor concentration, and $\varepsilon$ is the permittivity of a semiconductor.

The space charge density $\rho$ is described by the hole concentration p passing through the space charge region (depletion layer) during reverse recovery and the average donor concentration $N_d$ of the n− drift layer. The electron concentration is lower than these concentrations so as to be negligible and there is no acceptor. Therefore, $\rho \approx q(p+N_d)$ is established. In this case, the hole concentration p is determined by a breaking current of the diode. In particular, on an assumption in which the current is flowing, the rated current density of the element is represented as $p = JF/(qv_{sat})$. In addition, JF is the rated current density of the element and $v_{sat}$ is a saturated velocity in which the speed of the carrier is saturated with predetermined electric field intensity.

The Poisson equation is integrated with respect to the distance x two times and the voltage V satisfies $E = -gradV$ (the relation between the known electric field E and the voltage V). Therefore, under appropriate boundary conditions, $V = (1/2)(\rho/\varepsilon)x^2$ is established. The length x of the space charge region obtained when the voltage V is half of the rated voltage BV is the distance index L. This is because an operation voltage (power supply voltage), which is the voltage V, is about half of the rated voltage in the actual device, such as an inverter. When the doping concentration of the FS layer is higher than that of the n⁻ drift layer, the FS layer prevents the expansion of the space charge region which is spread during reverse recovery. In a case in which the anode current of the diode starts to be reduced from the breaking current due to the turn-off of a MOS gate, when the peak position of the FS layer which the depletion layer reaches initially is within the length range of the space charge region, it is possible to suppress the expansion of the space charge region, with the accumulated carriers remaining in the n⁻ drift layer. Therefore, the sweep of the remaining carriers is suppressed.

In the actual reverse recovery operation, for example, when a motor is driven by a known PWM inverter with an IGBT module, the power supply voltage or the breaking current is not fixed, but is variable. Therefore, in this case, the preferred peak position of the FS layer which the depletion layer reaches initially needs to have a given width. According to the results of the inventors' research, the distance X of the peak position of the FS layer which the depletion layer reaches initially from the rear surface is as illustrated in FIG. 18. FIG. 18 is a table illustrating the position conditions of the field stop layer which the depletion layer reaches initially in the semiconductor device according to the invention. FIG. 18 illustrates the distance X of the peak position of the FS layer which the end of the depletion layer reaches initially from the rear surface at a rated voltage of 600 V to 6500 V. Here, X=W0−γL is established and γ is a coefficient. FIG. 18 illustrates the distance X when γ is changed from 0.7 to 1.6.

As illustrated in FIG. 18, at each rated voltage, the element (diode) is safely designed so as to have a breakdown voltage which is about 10% higher than the rated voltage. As illustrated in FIG. 18, the total thickness of the n⁻ semiconductor substrate (the thickness during a finishing process after the n⁻ semiconductor substrate is thinned by, for example, grinding) and the average resistivity of the n⁻ drift layer are set such that an on-voltage or reverse recovery loss is sufficiently reduced. The term 'average' means the average concentration and resistivity of the entire n⁻ drift layer including the FS layer. The rated current density has the typical value illustrated in FIG. 18 due to the rated voltage. The rated current density is set such that energy density which is determined by the product of the rated voltage and the rated current density has a substantially constant value and has nearly the value illustrated in FIG. 18. When the distance index L is calculated using these values according the above-mentioned Expression (1), the value illustrated in FIG. 18 is obtained. The distance X of the peak position of the FS layer which the end of the depletion layer reaches initially from the rear surface is obtained by subtracting the product of the distance index L and γ, which is in the range of 0.7 to 1.6, from the thickness W0 of the n⁻ semiconductor substrate.

Figure 15:
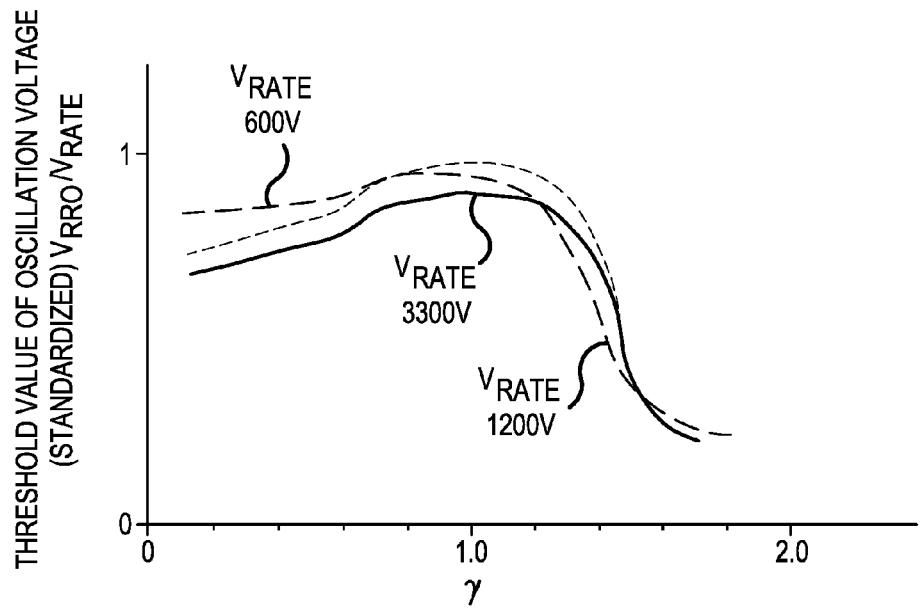
FIG. 15 is a characteristic diagram illustrating a threshold voltage at which a voltage waveform starts to oscillate.

The distance X of the peak position of the FS layer which the end of the depletion layer reaches initially from the rear surface, at which reverse recovery oscillation is sufficiently suppressed, is as follows with respect to the distance index L and the thickness W0 of the n⁻ semiconductor substrate. FIG. 15 is a characteristic diagram illustrating a threshold voltage at which the voltage waveform starts to oscillate. FIG. 15 is a graph illustrating the dependence of $V_{RRO}$ on γ at some typical rated voltages $V_{rate}$ (600 V, 1200 V, and 3300 V). In the graph, the vertical axis indicates a value obtained by standardizing $V_{RRO}$ with the rated voltage $V_{rate}$. As can be seen from the graph, it is possible to rapidly increase $V_{RRO}$ at three rated voltages when γ is equal to or less than 1.4. When γ is in the range of 0.8 to 1.3, it is possible to sufficiently increase $V_{RRO}$ at any rated voltage. More preferably, when γ is in the range of 0.9 to 1.2, it is possible to maximize $V_{RRO}$.

The important point in FIG. 15 is that the range of γ capable of sufficiently increasing $V_{RRO}$ is substantially the same (0.8 to 1.3) at any rated voltage. The reason is that it is most effective to set the range of the distance X of the peak position of the FS layer which the depletion layer reaches initially from the rear surface to be centered on W0−L (γ=1). That is, the above is caused by the nearly constant value of the product of the rated voltage and the rated current density. Therefore, when the distance X of the peak position of the FS layer which the end of the depletion layer reaches initially from the rear surface is set in the above-mentioned range, the accumulated carriers can sufficiently remain in the diode during reverse recovery and it is possible to suppress the oscillation phenomenon during reverse recovery. Therefore, for the distance X of the peak position of the FS layer which the end of the depletion layer reaches initially from the rear surface, it is preferable that the coefficient γ of the distance index L be in the above-mentioned range at any rated voltage. In this way, it is possible to effectively suppress the oscillation phenomenon during reverse recovery. In addition, the depth of the first stage from the rear surface is γ=1, that is, the range Rp1 of the first stage from the rear surface of the substrate is equal to or more than 15 μm in order to maximize the effect of suppressing oscillation.

As such, in order to obtain good switching characteristics, it is necessary to form the FS layer in a region which is at a depth of at least 15 μm from the rear surface of the semiconductor substrate. The inventors found that, when the average range of proton irradiation was set to 15 μm or more in order to form the FS layer in the region which is at a depth of 15 μm or more from the rear surface of the semiconductor substrate, the region in which protons reached a depth of 15 μm from the rear surface of the semiconductor substrate was a region in which carrier concentration by the SR method was significantly lower than the doping concentration of the semiconductor substrate, that is, a disorder region. This will be described with reference to FIG. 14.

Figure 8B:
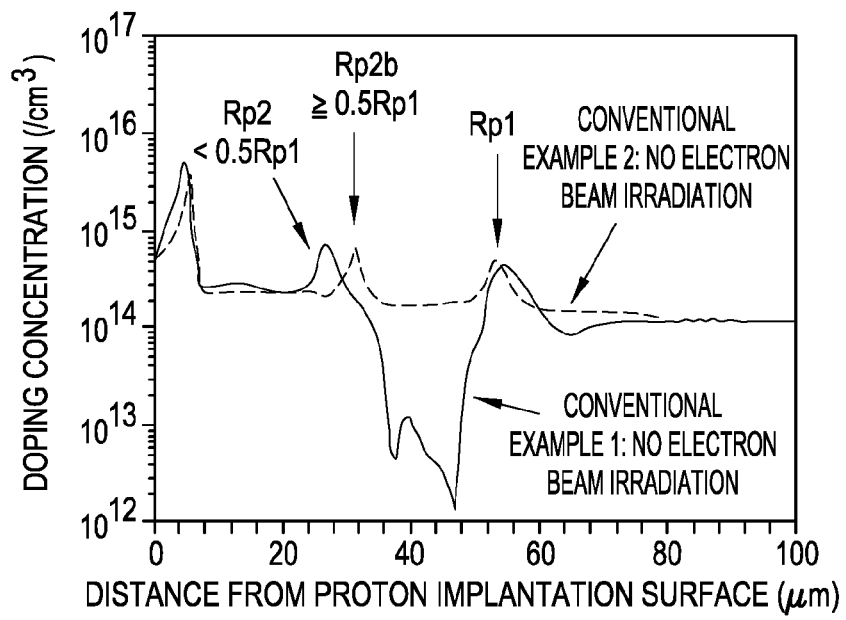
Figure 14A:
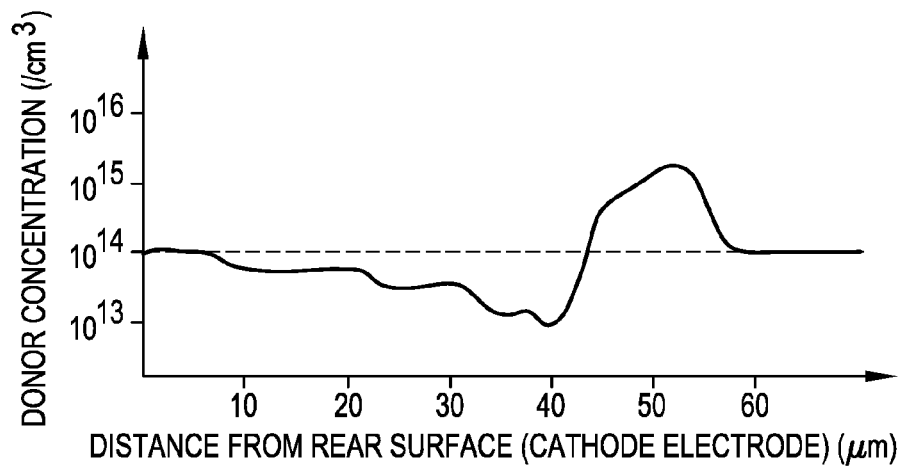
FIGS. 14(a) to 14(c) are characteristic diagrams illustrating the relation between carrier concentration and the average range of proton irradiation in the related art.
Figure 14B:
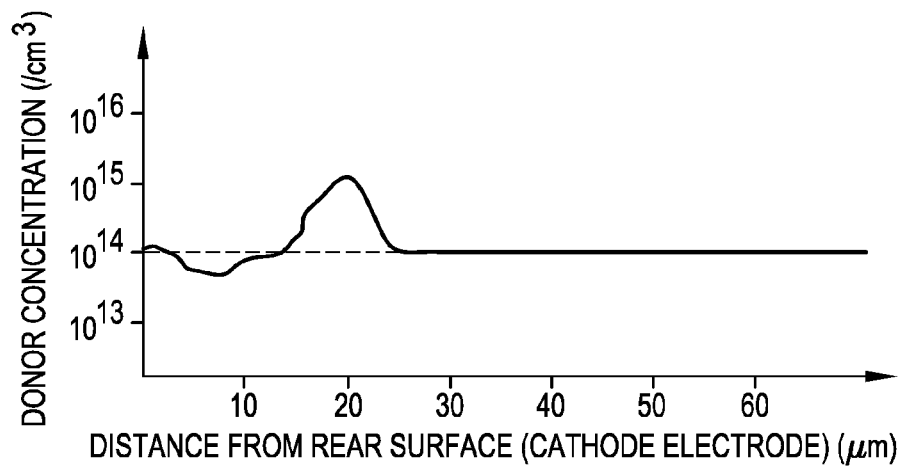
Figure 14C:
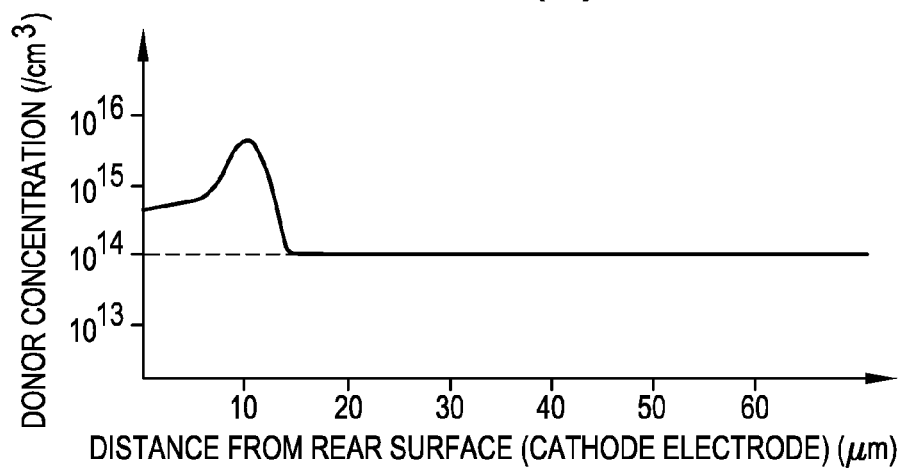

FIG. 14 is a characteristic diagram illustrating the relation between carrier concentration and the average range of proton irradiation in the related art. FIG. 14 illustrates the carrier concentration of the silicon substrate measured by the SR method after protons are irradiated to the silicon substrate and then a heat treatment is performed at 350° C. FIG. 14(a) illustrates a case in which the average range of the proton irradiation is 50 μm, FIG. 14(b) illustrates a case in which the average range of the proton irradiation is 20 μm, and FIG. 14(c) illustrates a case in which the average range of the proton irradiation is 10 μm. In FIGS. 14(a) to 14(c), the horizontal axis is the distance (depth) of the proton from an incident surface. In FIG. 14(c), when the average range of the proton irradiation is 10 μm, particularly, a reduction in carrier concentration does not appear in a proton passage region. In FIG. 8(b), when the average range of the proton irradiation is 20 μm, carrier concentration is lower than substrate concentration and a reduction in the carrier concentration appears. That is, disorder remains in the region. As can be seen from FIG. 14(a), when the average range of the proton irradiation is 50 μm, a reduction in the carrier concentration of the passage region is remarkable and a large amount of disorder remains. As such, when there is a disorder region in the semiconductor substrate, a leakage current or conduction loss increases, as described above. Therefore, it is necessary to remove disorder.

As described above, even when the range Rp (Rp1) of the first stage is sufficiently deep, carrier mobility is sufficiently recovered and it is important that carrier concentration is equal to or more than substrate concentration. The invention can solve the above-mentioned problems by performing proton irradiation a plurality of times.

Figure 17:
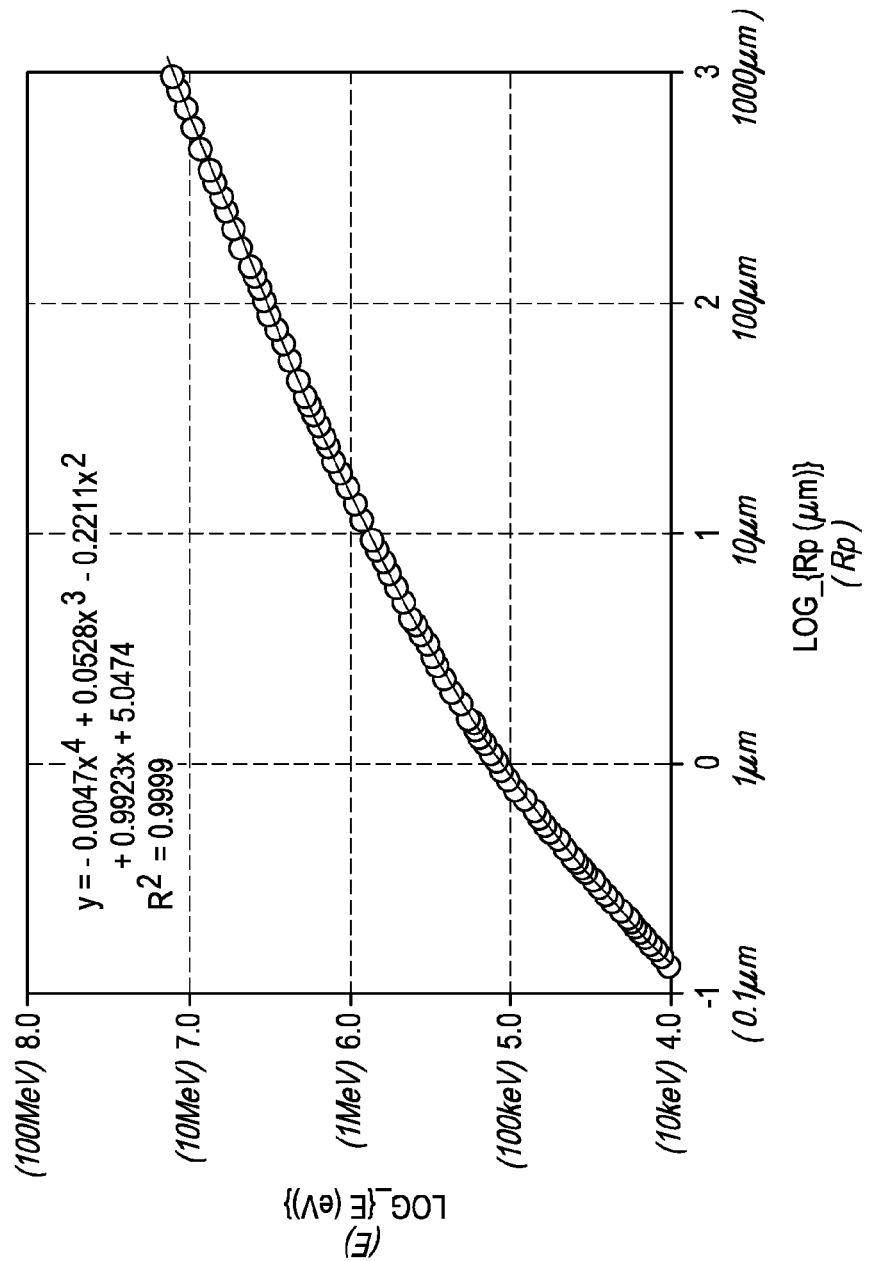
FIG. 17 is a characteristic diagram illustrating the relation between the range of protons and the acceleration energy of the protons in the semiconductor device according to the invention.

The acceleration energy of protons may be determined from the following characteristics graph illustrated in FIG. 17 in order to form the FS layer with the peak position which the depletion layer initially reaches and which is at the distance X from the rear surface using proton irradiation such that the above-mentioned range of γ is satisfied in practice.

The results of the inventors' research proved that, for the range Rp (the peak position of the FS layer) of protons and the acceleration energy E of protons, when the logarithm log(Rp) of the range Rp of the protons was x and the logarithm log(E) of the acceleration energy E of the protons was y, x and y satisfied the following relation represented by Expression (2).

$$y=-0.0047x^4+0.0528x^3-0.2211x^2+0.9923x+5.0474 \quad \text{Expression (2)}$$

FIG. 17 is a characteristics graph indicating the above-mentioned Expression (2). FIG. 17 is a characteristic diagram illustrating the relation between the range of the protons and the acceleration energy of the protons in the semiconductor device according to the invention. FIG. 17 illustrates the acceleration energy of the protons for obtaining the desired range of the protons. In FIG. 17, the horizontal axis is the logarithm log(Rp) of the range Rp of the protons and indicates the range Rp (µm) corresponding to the parentheses below the axis value of log(Rp). In addition, the vertical axis is the logarithm log(E) of the acceleration energy E of the protons and indicates the acceleration energy E of the protons corresponding to the parentheses below the axis value of log(E). The above-mentioned Expression (2) is obtained by fitting the value of the logarithm log(Rp) of the range Rp of the protons and the value of the logarithm log(E) of the acceleration energy with a four-order polynomial of x (=log (Rp)).

The following relation may be considered between the actual acceleration energy E' and an average range Rp' (proton peak position) which is actually obtained by the spreading resistance (SR) method when the above-mentioned fitting equation is used to calculate the acceleration energy E (hereinafter, referred to as the calculated value E) of proton irradiation from the desired average range Rp of protons and protons are implanted into the silicon substrate with the calculated value E of the acceleration energy. When the actual acceleration energy E' is in the range of about ±10% of the calculated value E of the acceleration energy, the actual average range Rp' is within the range of about ±10% of the desired average range Rp and is in a measurement error range. Therefore, the influence of a variation in the actual average range Rp' from the desired average range Rp on the electrical characteristics of an IGBT is so small to be negligible. When the actual acceleration energy E' is in the range of ±5% of the calculated value E, it is possible to determined that the actual average range Rp' is substantially equal to the set average range Rp. Alternatively, when the actual average range Rp' is in the range of about ±10% of the average range Rp obtained by applying the actual acceleration energy E' to the above-mentioned Expression (2), no problem occurs. In the actual accelerator, since the acceleration energy E and the average range Rp are both in the above-mentioned range (±10%), it is considered that the actual acceleration energy E' and the actual average range Rp' follow the above-mentioned fitting equation represented by the desired average range Rp and the calculated value E and no problem occurs. In addition, a variation or error range may be equal to or less than ±10% of the average range Rp. When the variation or error range is within the range of ±5%, it can be considered that the actual acceleration energy E' and the actual average range Rp' follow the above-mentioned Expression (2).

The above-mentioned Expression (2) is used to calculate the acceleration energy E of the protons required to obtain the desired range Rp of the protons. The acceleration energy E of each proton for forming the FS layer is also calculated by the above-mentioned Expression (2) and is well matched with the value of a sample which is measured by proton irradiation with the acceleration energy E' and the known spreading resistance measurement method (SR method). Therefore, when the above-mentioned Expression (2) is used, it is possible to predict the required acceleration energy E of protons with high accuracy, on the basis of the range Rp of the protons.

As described above, according to Embodiment 6, it is possible to obtain the same effect as that in Embodiment 1.

Embodiment 7

Figure 20:
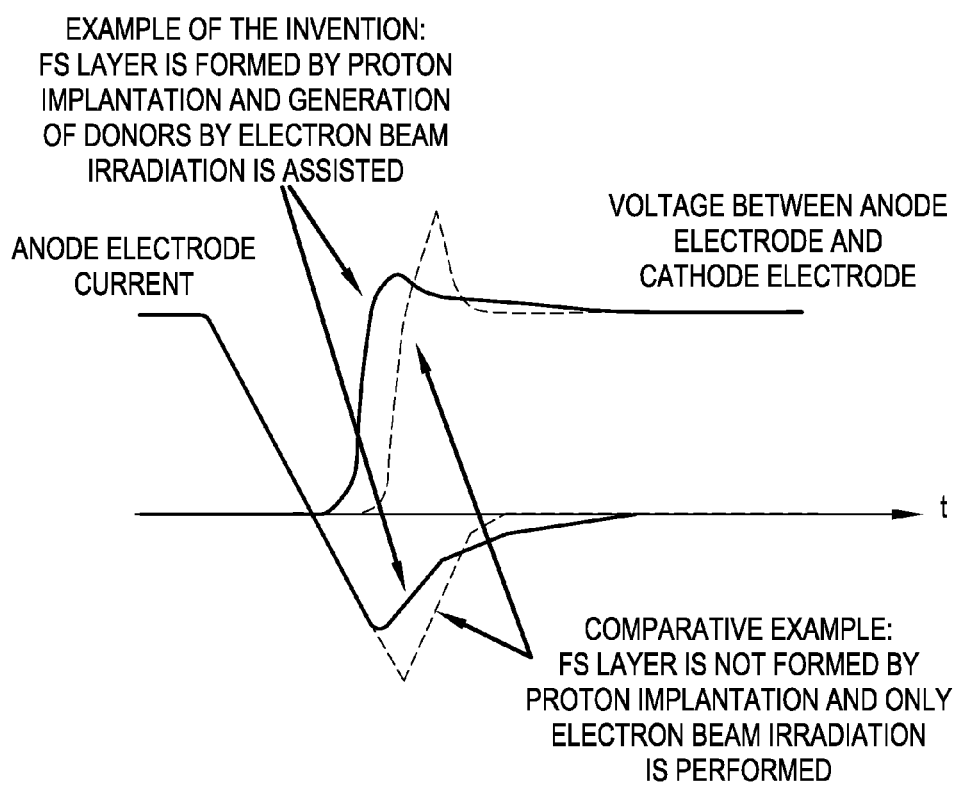
FIG. 20 is a characteristic diagram illustrating the reverse recovery waveform of the semiconductor device according to the invention.

FIG. 20 is a characteristic diagram illustrating the reverse recovery waveform of a semiconductor device according to the invention. FIG. 20 illustrates the reverse recovery waveform of the semiconductor device according to Embodiment 1 of the invention and a reverse recovery waveform according to a comparative example when proton implantation is not performed, but only electron beam irradiation is performed. A rated voltage was 1200 V. A silicon substrate produced by the FZ method was used, the doping concentration (average concentration) $N_d$ of the silicon substrate and the thickness W0 of the silicon substrate after grinding had values at a rated voltage of 1200 V illustrated in FIG. 18. In the invention, γ (corresponding to the range Rp1 in the first stage) is 1. In the invention, electron beam irradiation conditions were a dose of 300 kGy and acceleration energy of 5 MeV. In the comparative example, electron beam irradiation conditions were a dose of 60 kGy. In both the invention and the comparative example, a forward voltage drop at the rated current density (a 1200-V field in FIG. 18) was 1.8 V. The test is performed under the conditions that a power supply voltage $V_{CC}$ is 800 V and the initial normal anode current is the rated current (current density×an active area (about 1 cm²)). In a chopper circuit, flowing inductance with respect to a diode, a driving IGBT (similarly, 1200 V), and an intermediate capacitor is 200 nH.

As can be seen from FIG. 20, in the invention, a reverse recovery peak current is smaller than that in the comparative example and an overshoot voltage higher than the power supply voltage $V_{CC}$ is about 200 V lower than that in the comparative example. That is, the reverse recovery waveform according to the invention is a so-called soft recovery waveform. Therefore, even when lifetime control is performed by electron beam irradiation in which high-speed and hard recovery is likely to occur, the reverse recovery waveform according to the invention can be a very soft waveform, which is a peculiar effect that is not obtained in the related art.

Figure 13:
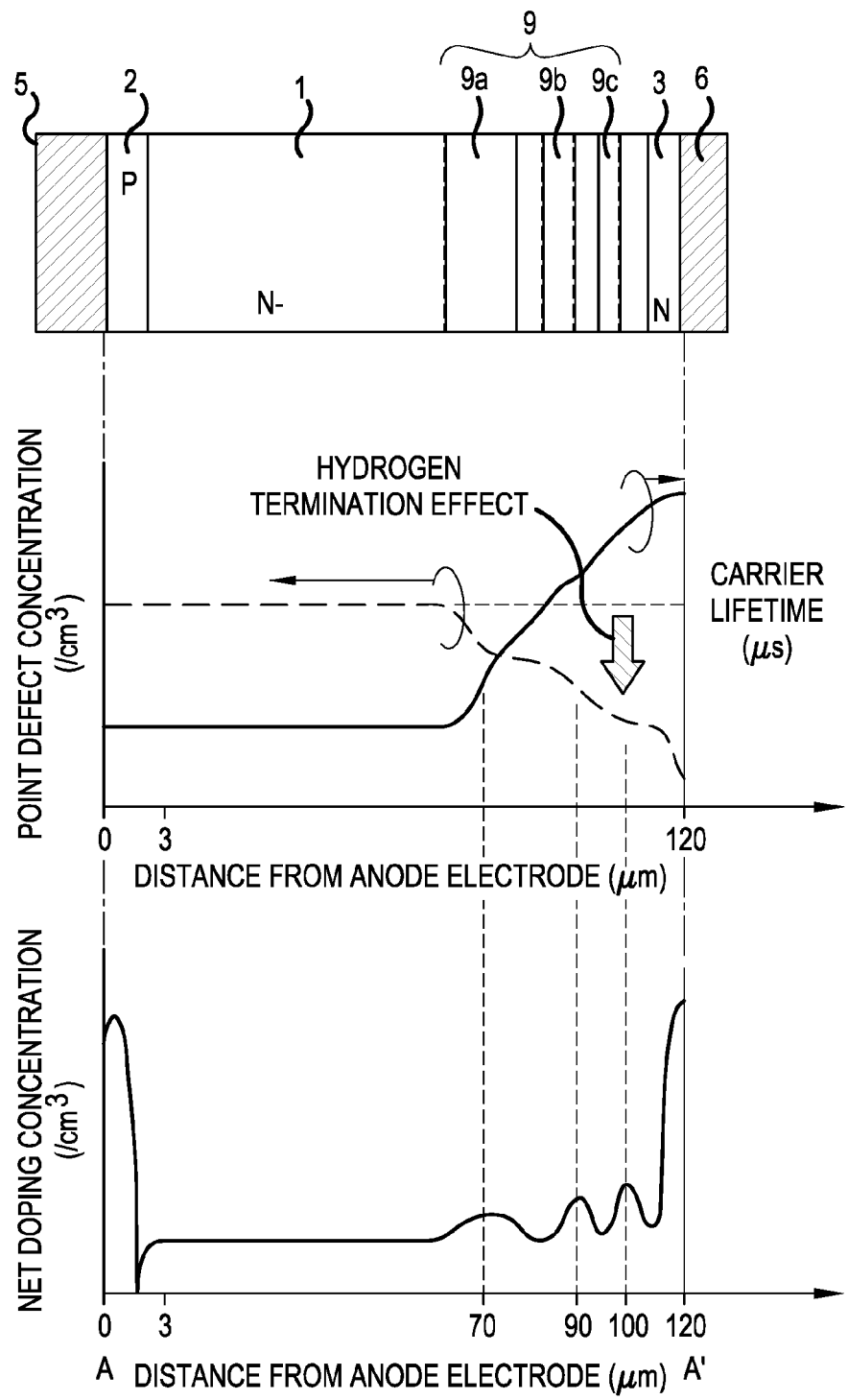
FIG. 13 is a characteristic diagram illustrating the carrier lifetime of the semiconductor device according to the invention.

The effect and operation (reason) of the invention will be described with reference to FIG. 13. FIG. 13 is a characteristic diagram illustrating the carrier lifetime of the semiconductor device according to the invention. FIG. 13 illustrates net doping concentration, point defect concentration, and carrier lifetime in the depth direction of anode electrode 5 in the diode which is produced according to Embodiment 2. In FIG. 13, reference numeral 9 (reference numerals 9a to 9c) denotes an n-type FS layer. It is presumed that the effect of the invention is obtained because the dangling bond is terminated by hydrogen atoms which are introduced by the implantation of protons into the rear surface of the substrate in the point defects (vacancies and divacancies) introduced by electron beam irradiation. The crystal defect which accelerates the generation and extinction of carriers is mainly a point defect and is energy center having a vacancy (V) and a divacancy (VV) as main components. In addition, the dangling bond is formed in the point defect (see FIG. 5). Protons are implanted into the portion in which the dangling bond is formed from the rear surface of the substrate and a heat treatment for generating donors is performed. Then, the crystal defects are relaxed and the portion returns to a state close to the normal crystal state. In this case, the dangling bond is terminated by a peripheral hydrogen atom. Therefore, the center including the vacancy (V) and the divacancy (VV) as main components disappears. On the other hand, as in the invention, when a donor (hydrogen induced donor) caused by the hydrogen atom is generated, a VOH defect of a vacancy (V), oxygen (O), and hydrogen (H) is a main component in the hydrogen induced donor. Therefore, the VOH defect is also formed only by the termination of the dangling bond by the hydrogen atom. It is presumed that the VOH defect accelerates the generation of a VOH donor while reducing the density of the vacancies (V) and the divacancies (VV) causing a leakage current or carrier recombination.

As illustrated in the middle part of FIG. 13, for the density of the point defects, a sufficiently amount of point defects generated by electron beam irradiation remain from the anode to n-type FS layer 9 and uniform lifetime distribution is formed by the above-mentioned phenomenon. In this case, the lifetime is, for example, equal to or more than 0.1 µs and equal to or less than 3 µs. In a portion from n-type FS layer 9 to the cathode on the rear surface of the substrate, hydrogen concentration is increased by proton implantation at a depth of about 70 µm or more (that is, closer to the cathode) from the front surface of the substrate. Since the dangling bond is terminated by the hydrogen atom, point defect concentration is reduced. The carrier lifetime on the rear surface side of the substrate is longer than the carrier lifetime, 0.1 µs to 3 µs on the front surface side of the substrate and is, for example, about 10 µs. The carrier lifetime on the rear surface side of the substrate is equal to or sufficiently close to the carrier lifetime (10 µs or more) when electron beam irradiation is not performed. Therefore, the concentration distribution of the minority carriers (not illustrated) (in this case, holes) is sufficiently low on the anode side and is sufficiently high on the cathode. As a result, an ideal carrier concentration distribution is obtained by the soft recovery characteristics of the diode.

As described above, according to Embodiment 7, it is possible to obtain the same effect as that in Embodiment 1.

Embodiment 8

Figure 19A:
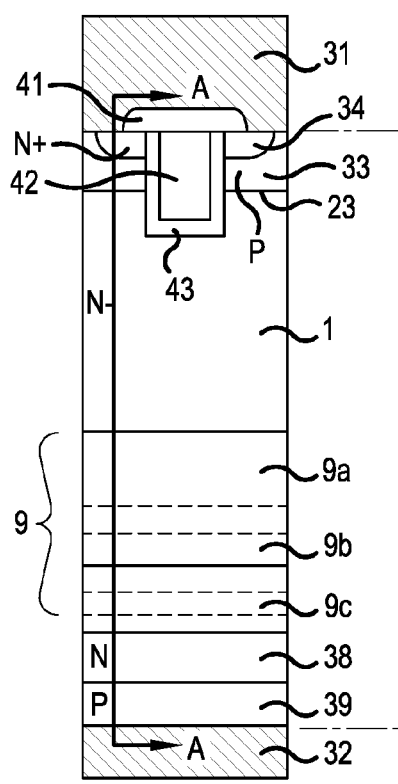
FIGS. 19(a) and 19(b) are diagrams illustrating a semiconductor device according to Embodiment 8.
Figure 19B:
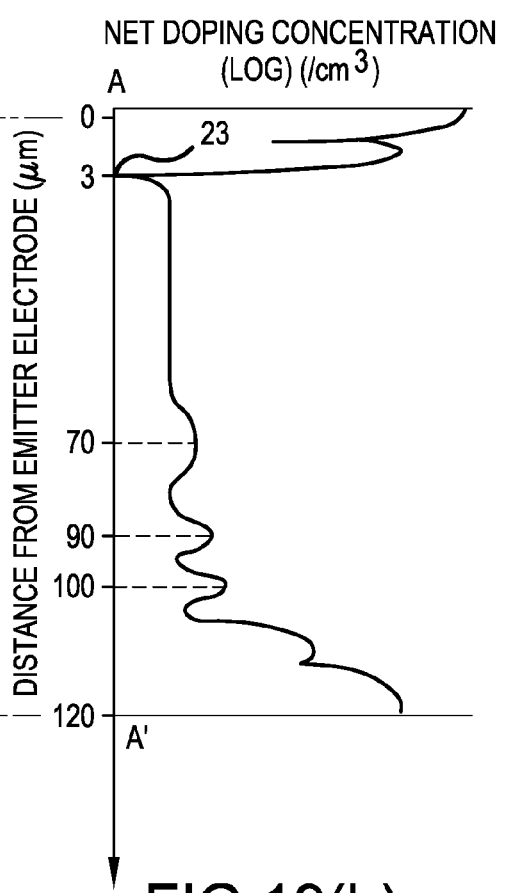

FIG. 19 is a diagram illustrating a semiconductor device according to Embodiment 8. The semiconductor device according to Embodiment 8 is an example in which the structure of the semiconductor device according to Embodiment 1 is applied to an IGBT. FIG. 19(a) illustrates the cross-sectional structure of the IGBT and FIG. 19(b) illustrates a net doping concentration distribution on the line A-A' of FIG. 19(a). In a method for producing the semiconductor device according to Embodiment 8, the element structure of the IGBT may be formed, instead of the element structure of the diode in the semiconductor device production methods according to Embodiments 1 to 5.

As illustrated in FIG. 19, in the IGBT, it is possible to obtain the effect of accelerating the change of hydrogen (related defect) into a donor by controlling point defect concentration using electron beam irradiation or neutron beam irradiation, similarly the diode according to Embodiment 1. In the IGBT, the carrier lifetime is not actively reduced, unlike the diode. Therefore, the average of the carrier lifetime may be equal to or less than 10 µs by a heat treatment which is performed after proton implantation. In this case, the temperature of the heat treatment is preferably equal to or higher than, for example, 380° C. and more preferably, equal to or higher than 400° C. and equal to or lower than 450° C.

In FIG. 19, reference numeral 9 (reference numerals 9a to 9c) denotes an n-type FS layer. Reference numeral 31 denotes an emitter electrode, reference numeral 32 denotes a collector electrode, reference numeral 33 denotes a p base layer, reference numeral 34 denotes an n$^+$ emitter region, reference numeral 38 denotes an n buffer layer, reference numeral 39 denotes a p collector layer, reference numeral 41 denotes an interlayer insulating film, reference numeral 42 denotes a gate electrode, and reference numeral 43 denotes a gate insulating film. Reference numeral 1 denotes an n$^-$ semiconductor substrate which will be an n$^-$ drift layer and reference numeral 23 denotes an interface between the n$^-$ drift layer and the p base layer 33.

As described above, according to Embodiment 8, it is possible to obtain the same effect as that in Embodiment 1.

As described above, in the invention, when the invention is applied to the IGBT, a p$^+$ collector region may be formed by the implantation of p-type impurity ions, such as boron (B) ions, and a thermal activation process, instead of the process of forming the n$^+$ cathode layer using the implantation of n-type impurity ions and thermal activation. In the above-described embodiments, the silicon substrate is used as the semiconductor substrate. However, a SiC (silicon carbide) substrate or a GaN (gallium nitride) substrate may be used. In this case, the same effect as described above is expected.

As described above, the semiconductor device and the method for producing the semiconductor device according to the invention are useful as power semiconductor devices used for power conversion apparatuses such as converters or inverters.

Thus, a semiconductor device and method for producing it have been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

REFERENCE SIGNS LIST 1 thin n$^-$ semiconductor substrate
1a rear surface of thin n$^-$ semiconductor substrate 1
1b front surface of thin n$^-$ semiconductor substrate 1
2 p-type anode region
3 n$^+$ cathode layer 4 junction edge termination structure
5 anode electrode
6 cathode electrode
8 insulating film
9 n-type field stop layer
11 electron beam irradiation
12 crystal defect generated by electron beam irradiation 11
13 proton implantation
14 hydrogen atom
15 crystal defect generated by proton implantation 13
18 donor layer
20 thick n⁻ semiconductor substrate
20a front surface of thick n⁻ semiconductor substrate 20
20b rear surface of thick n⁻ semiconductor substrate 20
21 grinding
100 diode

What is claimed is:

1. A method for producing a semiconductor device that forms a donor layer in a semiconductor substrate using proton implantation, comprising:
    a crystal defect forming step of generating crystal defects in the semiconductor substrate before or after a proton implantation, wherein the crystal defects are formed with either electron beam irradiation or helium irradiation; and
    a donor layer forming step of forming the donor layer in the semiconductor substrate using the proton implantation and a first heat treatment, wherein the crystal defects are formed before the first heat treatment and contribute to the generation of donors during the first heat treatment, and wherein the crystal defects are not completely recovered during the first heat treatment so that some of the crystal defects remain in the donor layer.

2. The method for producing a semiconductor device according to claim 1, wherein the crystal defect forming step generates the crystal defects such that a predetermined amount of crystal defects remain in the semiconductor substrate during the first heat treatment.

3. The method for producing a semiconductor device according to claim 1, wherein the crystal defect forming step generates the crystal defects using electron beam irradiation.

4. The method for producing a semiconductor device according to claim 1, wherein the crystal defects which remain in the semiconductor substrate during the first heat treatment contribute to the formation of the donor layer.

5. The method for producing a semiconductor device according to claim 1, wherein the crystal defect forming step performs a second heat treatment to adjust an amount of crystal defects in the semiconductor substrate after the crystal defects are formed.

6. The method for producing a semiconductor device according to claim 1, wherein the first heat treatment is performed under conditions of a temperature of 350° C. to 550° C. and a processing time of 1 to 10 hours.

7. The method for producing a semiconductor device according to claim 1, further comprising a step of grinding one main surface of the semiconductor substrate before the proton implantation.

8. The method for producing a semiconductor device according to claim 7, wherein the proton implantation is performed from a rear surface of the semiconductor substrate.

9. The method for producing a semiconductor device according to claim 1, wherein the proton implantation is performed one or more times and the range of the proton implantation which is performed at least once is equal to or more than 15 μm from the rear surface of the semiconductor substrate.

10. The method for producing a semiconductor device according to claim 1, wherein the donor layer is an n-type field stop layer of a diode or an insulated gate bipolar transistor.

11. The method for producing a semiconductor device according to claim 1, wherein a processing temperature of the donor layer forming step performed after the first heat treatment is lower than the temperature of the first heat treatment.

12. The method according to claim 1, wherein the lifetime of minority carriers in the donor layer is equal to or less than 10 μs.

13. The method according to claim 1, wherein the lifetime of the carriers in the donor layer is in the range of 0.1 μs to 1 μs.

14. A semiconductor device that forms a donor layer in a semiconductor substrate using proton implantation and is produced by
    a crystal defect forming step of generating crystal defects before or after a proton implantation, wherein the crystal defects are formed in the semiconductor substrate with either electron beam irradiation or helium irradiation and
    a donor layer forming step of forming the donor layer in the semiconductor substrate using the proton implantation and a first heat treatment, wherein the crystal defects are formed before the first heat treatment and contribute to the generation of donors during the first heat treatment, and wherein the crystal defects are not completely recovered during the first heat treatment so that some of the crystal defects remain in the donor layer.

* * * * *